(12) United States Patent
Glidden et al.

(10) Patent No.: US 7,307,528 B2
(45) Date of Patent: *Dec. 11, 2007

(54) RFID TAG DESIGN WITH CIRCUITRY FOR WAFER LEVEL TESTING

(75) Inventors: Robert M. Glidden, Rancho Palos Verdes, CA (US); Dennis Kiyoshi Hara, Bellevue, WA (US); Ronald A. Oliver, Seattle, WA (US); Jay A. Kuhn, Seattle, WA (US); John D. Hyde, Corvallis, OR (US)

(73) Assignee: IMPINJ, Inc., Seattle, WA (US)

( * ) Notice: Subject to any disclaimer, the term of this patent is extended or adjusted under 35 U.S.C. 154(b) by 351 days.

This patent is subject to a terminal disclaimer.

(21) Appl. No.: 11/014,075

(22) Filed: Dec. 15, 2004

(65) Prior Publication Data

US 2006/0125505 A1   Jun. 15, 2006

(51) Int. Cl.
*G01R 31/26* (2006.01)

(52) U.S. Cl. .................. 340/572.1; 324/765; 324/537; 324/754; 324/759; 324/763

(58) Field of Classification Search ............ 340/572.1, 340/572.5, 514–515, 635, 655; 324/537, 324/754, 759, 763, 765, 755, 757, 615; 702/183
See application file for complete search history.

(56) References Cited

U.S. PATENT DOCUMENTS

| | | | |
|---|---|---|---|
| 4,495,628 A | 1/1985 | Zasio | |
| 4,495,629 A | 1/1985 | Zasio | |
| 4,912,709 A | 3/1990 | Teske et al. | |
| 4,969,148 A | 11/1990 | Nadeau-Dostie et al. | |
| 5,003,204 A | 3/1991 | Cushing et al. | |
| 5,053,700 A | 10/1991 | Parrish | |
| 5,130,568 A | 7/1992 | Miller et al. | |
| 5,254,942 A | 10/1993 | D'Souza et al. | |
| 5,257,223 A | 10/1993 | Dervisoglu | |
| 5,355,369 A | 10/1994 | Greenberger et al. | |
| 5,648,661 A | 7/1997 | Rostoker et al. | |
| 5,689,517 A | 11/1997 | Ruparel | |
| 5,831,330 A | 11/1998 | Chang | |
| 6,070,252 A | 5/2000 | Xu et al. | |
| 6,104,291 A | 8/2000 | Beauvillier et al. | |

(Continued)

OTHER PUBLICATIONS

IMPINJ, Inc., Products, *How RFID Works*, pp. 2, printed Apr. 30, 2004, www.impinj.com/products/rfid/applications.php.

(Continued)

*Primary Examiner*—Jeffery Hofsass
*Assistant Examiner*—Hongmin Fan
(74) *Attorney, Agent, or Firm*—Blakely, Sokoloff, Taylor & Zafman, LLP

(57) ABSTRACT

Technologies suitable for on-wafer testing in the ubiquitous computing era are disclosed. Among the inventive features disclosed are: 1) clustering of wafer test probe landing area sites for parallel test sequencing; 2) on wafer test wiring that runs along the wafer's scribe regions; 3) on-wafer test wiring that can be scribed and yet thwart the spread of contamination into the product die; 4) an RFID tag design that allows for on-wafer testing without imposing substantial semiconductor surface area penalty; 5) an RFID tag design that includes built-in self test (BIST) circuitry for the RFID tag's non-volatile memory.

45 Claims, 18 Drawing Sheets

U.S. PATENT DOCUMENTS

| | | | |
|---|---|---|---|
| 6,122,762 | A | 9/2000 | Kim |
| 6,137,155 | A | 10/2000 | Seshan et al. |
| 6,236,223 | B1 | 5/2001 | Brady et al. |
| 6,249,227 | B1 | 6/2001 | Brady et al. |
| 6,357,025 | B1 | 3/2002 | Tuttle |
| 6,380,729 | B1 | 4/2002 | Smith |
| 6,404,684 | B2 | 6/2002 | Arimoto et al. |
| 6,412,086 | B1 | 6/2002 | Friedman et al. |
| 6,412,786 | B1 | 7/2002 | Pan |
| 6,426,904 | B2 | 7/2002 | Barth et al. |
| 6,525,410 | B1 | 2/2003 | Gelsomini et al. |
| 6,563,751 | B1 | 5/2003 | Wu |
| 6,566,736 | B1 | 5/2003 | Ogawa et al. |
| 6,666,380 | B1 | 12/2003 | Suzuya |
| 6,727,722 | B2 * | 4/2004 | Whetsel ............... 324/765 |
| 6,774,470 | B2 | 8/2004 | Yagi et al. |
| 6,806,494 | B2 | 10/2004 | Fenner et al. |
| 6,838,773 | B2 | 1/2005 | Kikuchi et al. |
| 6,865,701 | B1 | 3/2005 | Youngs et al. |
| 6,888,365 | B2 | 5/2005 | Ma et al. |
| 6,930,499 | B2 | 8/2005 | Van Arendonk et al. |
| 6,962,827 | B1 | 11/2005 | Furue et al. |
| 6,982,190 | B2 | 1/2006 | Roesner |
| 7,023,347 | B2 | 4/2006 | Arneson et al. |
| 7,119,567 | B2 | 10/2006 | Ma et al. |
| 2002/0094596 | A1 | 7/2002 | Higuchi |
| 2002/0094639 | A1 | 7/2002 | Reddy |
| 2002/0125546 | A1 | 9/2002 | Muta |
| 2005/0083203 | A1 | 4/2005 | Surkau |
| 2005/0155213 | A1 | 7/2005 | Eastin |
| 2005/0212674 | A1 | 9/2005 | Desmons et al. |
| 2005/0241146 | A1 | 11/2005 | Hamburgen |
| 2006/0038687 | A1 | 2/2006 | White et al. |
| 2006/0125506 | A1 * | 6/2006 | Hara et al. ............... 324/765 |
| 2006/0145710 | A1 | 7/2006 | Puleston et al. |

OTHER PUBLICATIONS

IMPINJ, Inc., *Self-Adaptive Silicon*, pp. 7, printed Apr. 30, 2004, www.impinj.com/technology/index.php.

Jarwala, N., *Designing Dual Personality IEEE 1149.1 Compliant Multi-Chip Modules*, 1994, IEEE International Test Conference, paper 19.3, pp. 446-455.

Oakland, S., *Considerations for Implementing IEEE 1149.1 on System-on-a-Chip Integrated Circuits*, Test Conference, 2000, Proceedings International, Oct. 3-5, pp. 628-637.

Levitt, M., et al., *Testability, Debuggability, and Manufacturability Features of the UltraSPARCTM-I Microprocessor*, 1995, International Test Conference, paper 6.2, pp. 157-166.

Wood, S., et al., *A 5 GB/s 9-Port Application Specific SRAM with Built-in Self Test*, 1995 International Workshop on Memory Technology, Design and Testing, Aug. 7-8, pp. 68-73.

Yurash, S., et al., *Automatic Test Pattern Generation Comes of Age*, Electronic Engineering, vol. 63, No. 777, Sep. 1991, London GB, pp. 35-36 & 38.

Eichelberger, E.B., et al., *A Logic Design Structure for LSI Testability*, Reprinted from the Proceedings of the 14th Design Automation Conference by the Institute of Electrical and Electroincs Engineers, Inc., pp. 206-212 (1997).

Youngs, L., et al., *Design of the UltraSPARCTM-I Microprocessor for Manufacturing performance*, pp. 179-186, SPIE vol. 2874, Texas Instruments, Inc., Stafford, Texas, USA, assessed Mar. 8, 2004.

Atmel, *IEEE 1149.1-1990 Standard Test Access Port Boundary Scan*, 1900 IEEE Standard 1149.1, pp. 6, Sep. 1999.

Dennis Kiyoshi Hara, et al., "RFID Tag With Bist Circuits", U.S. Appl. No. 11/014,076, filed on Dec. 15, 2004, Notice of Allowance Office Action mailed Jan. 22, 2007. The Notice of Allowance Office Action, claims as they stood in the application prior to the mailing of the Notice of Allowance Office Action and a copy of the Claims as they were presented to the PTO in response to the Notice of Allowance Office Action. Notice of Allowance Office Action mailed Jun. 28, 2007. The Notice of Allowance Office Action and a copy of the claims as allowed.

John D. Hyde, et al., "Wafer Level Testing for RFID Tags", U.S. Appl. No. 11/014,523, filed on Dec. 15, 2004, Restriction Requirement Office Action mailed Jun. 23, 2006 and Office Action mailed Oct. 20, 2006. The Office Actions and claims as they stood in the application prior to the mailing of the Office Action and claims as presented to the PTO in response to the office actions.

* cited by examiner

FIG. 7E

RFID TAG DESIGN WITH CIRCUITRY FOR WAFER LEVEL TESTING

CROSS REFERENCE

Cross Reference to related U.S. patent application Ser. No. 11/014,523, filed on Dec. 15, 2004, titled, "Wafer Level Testing For RFID Tags", by John Hyde, Rob Glidden, Andy Horch, Jay Kuhn and Ron Oliver, and U.S. patent application Ser. No. 11/014,076, filed on Dec. 15, 2004, titled, "RFID Tag With BIST Circuitry" by Dennis Hara and Rob Glidden and U.S. patent application Ser. No. 11/069,515, filed on Feb. 28, 2005, titled. "Wireless Functional Testing Of RFID Tag" by Andrew E. Horch and U.S. patent application Ser. No. 11/069,005 filed on Feb. 28, 2005, titled, "On Die RFID Tag Antenna" Andrew E. Horch.

FIELD OF INVENTION

The field of invention relates generally to the electronic arts; and, more specifically, to approaches for highly efficient on wafer functional testing.

BACKGROUND

"Moore's law" essentially describes the fundamental relationship between technological progress in the semiconductor arts and its commercial applications. According to one version of Moore's law, continually reduced transistor size (approximately a 60% critical dimension reduction every 18 months) and continually increased wafer size has resulted in the persistent decline of semiconductor integrated circuit "per unit cost". The history of the computing industry over the past 35-40 years serve as a proof of Moore's law in which shipped volume continually expands while per unit cost continually falls.

Over the course of the 1960s, 1970s and into the 1980s, the growth of the industry depended on low volume, highly expensive mainframe computers that were only affordable to large organizations such as major corporations and government institutions. From the 1980s through the 1990s the primary growth market of the industry shifted into higher volume but less expensive personal computers targeted for most desktops (home or office) in the industrialized world.

Currently, in the mid 2000s, another shift is underway in which the growth of the industry is expected to depend (often wirelessly) on commodity-like computing systems that are shipped in extraordinarily high volumes and are priced at extraordinarily low prices. This new era, referred to by some as the "ubiquitous computing" era, is expected to transfer the focus of new uses for computing intelligence from approximately every person (as with the personal computer) to potentially almost any object.

Traditional perspectives are therefore being challenged that computing system intelligence is too expensive to implement in certain "cost sensitive" applications. Examples include, to list just a few, smart electricity meters that transmit a home's electricity usage to a utility company, smart refrigerators that can download the identity of its contents to its owner's personal digital assistant while the owner is shopping in the grocery store; and, smart automobile dashboards that can track a car's GPS location and dynamically provide correct driving instructions to a specific destination.

Another "ubiquitous computing" application is Radio Frequency IDentification (RFID) tags. An RFID tag is a semiconductor chip that can positively respond to a wireless signal that inquires into the RFID tag's existence. RFID tags are expected to be applied at least to automated inventory management and distribution systems. As an example, after affixing an RFID tag to a pallet, the pallet will be able to wirelessly identify itself so as to enable the ability to track its whereabouts or manage its logistical transportation in an automated fashion.

RFID tags, like other solutions for the ubiquitous computing era, are sensitive to costs of production. Here, the less expensive an RFID tag, the easier it is to justify the expense of distributing RFID tags amongst goods that are warehoused and/or transported. In order to improve the cost structure of an RFID tag, its cost of manufacturing must be understood.

RFID tags, being semiconductor chips, are manufactured on wafers each containing many discrete RFID tag chips. If the RFID tag chips from a same wafer are not functionally tested for the first time until after they have been diced from the wafer and individually packaged, the expense of packaging the portion of chips that ultimately fail their functional test is pure economic waste. Therefore it behooves the RFID tag manufacturer to eliminate this waste through "on wafer" functional testing.

On wafer functional testing is the functional testing of semiconductor chips that have not yet been diced into individual chips from their corresponding wafer. FIG. 1a shows a traditional wafer 100 that has been organized into multiple identical patterns, each consisting of geometric data present on a mask set, or "reticle". (Though the term "reticle" literally applies to the tooling used to pattern the wafer, herein we shall use the term to signify the portion of a wafer uniquely fabricated from this pattern, for expediency.) A single reticle 101 has been shaded in FIG. 1a. Each reticle typically contains multiple semiconductor chips (often identically designed). Breaking down the design of the wafer as a whole into an array of reticles allows for "step-and-repeat" processes that are applied to the wafer during the manufacture of its semiconductor chips (e.g., photolithography).

Referring to FIG. 1b, when the chips on the semiconductor wafer 100 are ready to be tested, a tester 103 applies and receives test signals through a wafer test probe 102. A wafer test probe 102 is a special fixture that is designed to land on specific "landing pads" that have been manufactured on the wafer 100 for the purpose of receiving and/or sending test signals from/to the tester 103 to/from the wafer 100. Based on the results observed by the tester 103 in response to the signals applied by the tester 103, the tester identifies defective chips. The defective chips are identified as scrap, and, as a consequence, any packaging and further testing costs associated with their production is avoided.

SUMMARY

An RFID tag is described having a receive signal path from one or more primary inputs to a controller. The receive signal path is to process an electrical receive signal originating from the input(s) as a consequence of the inputs having received a wireless signal. The RFID tag has a second signal path flowing into the receive signal path from a die edge of the RFID tag. The second signal path is to transport an electrical test signal that emulates the receive signal while the RFID tag is being tested on wafer. The receive signal path flows through both a first input of a logic circuit and the logic circuit's output. The logic circuit has a second input coupled to the second signal path.

BRIEF DESCRIPTION OF THE DRAWINGS

Figures

The present invention is illustrated by way of example and not limitation in the figures of the accompanying drawings, in which like references indicate similar elements and in which:

FIG. 3b shows an "on wafer" testing method that can be performed with the reticle design of FIG. 3a;

FIGS. 7a through 7e relate to the testing of a semiconductor chip's non volatile memory "on-wafer" with "built-in-self-test" (BIST) circuitry that has been embedded into the semiconductor chip.

DETAILED DESCRIPTION

Implementing on-wafer testing in the ubiquitous computing era is particularly challenging because, even though the avoidance of packaging defective die will result in cost savings, those savings can be easily diminished if the functional testing is too slow; and/or, if the additional circuitry used to support on wafer testing consumes too much semiconductor surface area.

Here, as discussed in the background, a typical feature of the ubiquitous computing era is the extremely low cost of the manufactured end product. As prolonged test times and larger die size each correspond to increased production costs, a well designed on-wafer test technology will be able to successfully test semiconductor chips without prohibitively increasing the production costs, as influenced by the testing time and size, of each manufactured die.

By emphasizing extremely small die size, at today's minimum feature sizes, tens and possibly hundreds of thousands of die can be manufactured on a single wafer; which, in turn, corresponds to a massive number of manufactured end product per unit of fixed production cost (i.e., the cost of processing a wafer). With massive numbers of die on wafer, individually testing each die on wafer can easily lead to prolonged test times if the testing technology is not efficiently designed.

At another extreme, if a chip designer integrates a significant amount of circuitry into the die's design in order to make the die capable of being tested on wafer, the number of die per wafer can be dramatically reduced (owing to increased die size). Thus, a successful on wafer testing approach will be able to limit the die size increase imposed by on wafer testing; while, at the same time, streamline the testing methodology itself so that an entire wafer having a massive number of die can be fully tested within a reasonable amount of time.

The following detailed description outlines a number of features that address the issues described above. The detailed description has been divided into three primary sections in an attempt to organize these features.

A first section, "1.0 Reticle Design", outlines reticle design features that promote reduced test times through "parallelization" of specific testing sequences; and, efficiently uses wafer surface area by integrating on-wafer testing circuitry in traditionally unused areas. A second section "2.0 Die Design" outlines a design for an RFID tag die that includes various design efficiencies that enable the die to be tested on-wafer without dramatically increasing the transistor count of the die. A third section "3.0 Built-In-Self-Test (BIST)" describes in significant detail a particular feature of the die design presented in Section 2.0 that permits on-die memory space to be thoroughly and rapidly tested without dramatically increasing the per die test time and/or complexity of the die's design.

Each of these sections is presented in sequence immediately below.

1.0 Reticle Design

Figure 2:
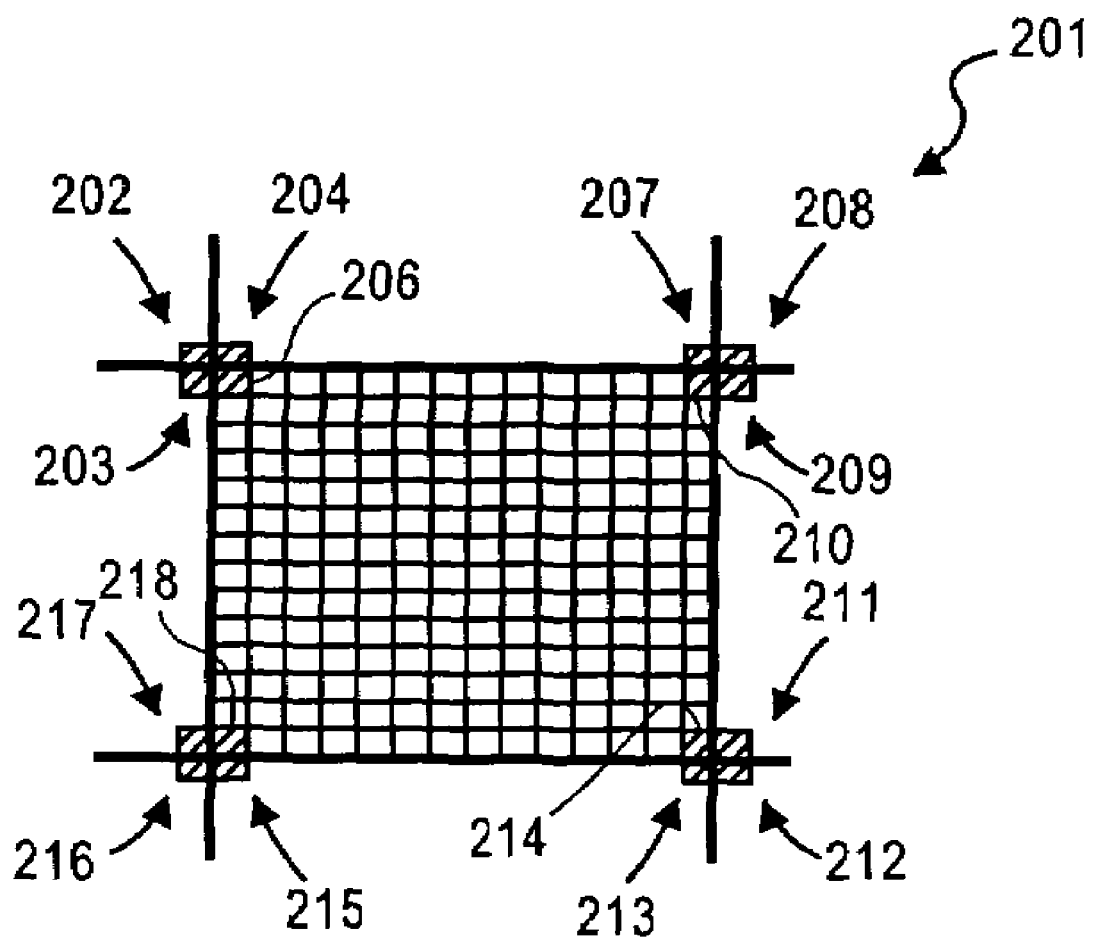
FIG. 2 shows an embodiment of a reticle design for a wafer.

FIG. 2 shows a full reticle 201 and portions of its eight neighboring reticles. Within the reticle a grid is observed that depicts the reticle's individual die sites. A die site is the semiconductor wafer surface area where an individual chip is located. According to the depiction of FIG. 2, each of the reticle's "corner" die sites 206, 210, 214, 218 have been shaded. A shaded die site in FIG. 2 is meant to depict a die site that has been designed to include wafer test probe landing pads (i.e., a "test probe" site). These may appear in the corners, near the corners, or at any convenient location within the reticle.

Figure 1A:
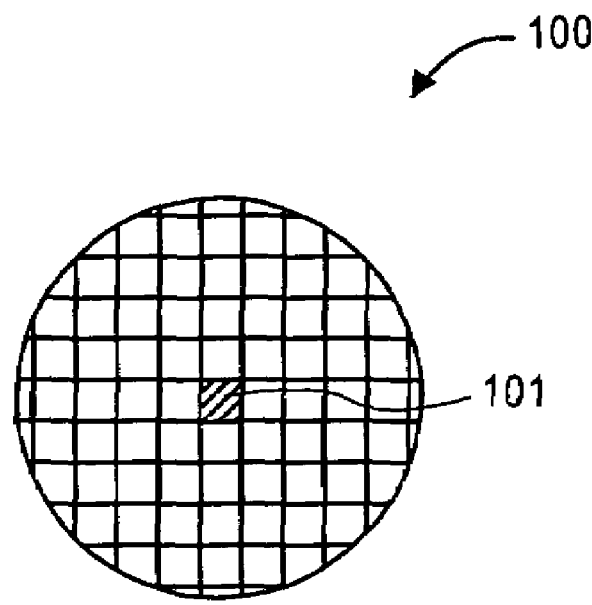
FIG. 1a shows a semiconductor wafer.
Figure 1B:
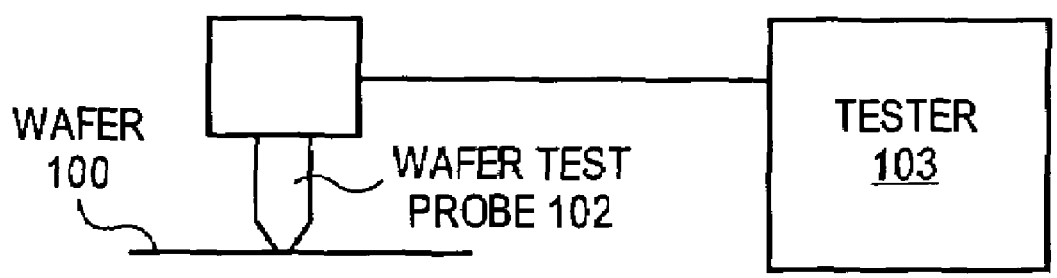
FIG. 1b shows a wafer tester and corresponding test probe involved in the testing of a wafer.

Recall from the discussion in the background of FIG. 1b that a wafer test probe 102 is a special fixture that is designed to land on specific "landing pads" that have been manufactured on the wafer 100 for the purpose of receiving and/or sending test signals from/to the tester 103 to/from the wafer 100. As such, referring to FIG. 2, each of test probe sites 206, 210, 214 and 218 include such landing pads so that a wafer test probe may make contact with them and apply/receive signals to/from the individual die within the reticle 201. As will be discussed in more detail further below with respect to FIG. 3a, in an embodiment, each corner test probe site is wired (e.g., through a bus) to each "product" die site in the reticle 201.

In the depiction of FIG. 2 not only are the corner die sites 206, 210, 214, 218 of the reticle 201 used as a test probe sites, but also, the corner dies sites 202, 203, 204, 207, 208, 209, 211, 212, 213, 215, 216, 217 of each of the reticle's six neighboring reticles are also used as test probe sites. Owing to the symmetries of a grid of reticles each containing a grid of die sites, designing each reticle so as to have a its corner die sites reserved as test probe die sites results in the formation of "clusters" of test probe sites (e.g., a first cluster that includes die sites 202, 203, 204, 206; a second cluster that includes die sites 207, 208, 209, 210;, etc.).

The presence of the clusters can dramatically improve the time efficiency of the wafer testing procedure through "parallelization" of reticle testing. Here, according to traditional approaches, on wafer testing was essentially a step-and-repeat process at a single die level of granularity. That is, a wafer probe would "land on" a single die, test it, and then move on to a next die site. By so doing, time is consumed moving the positioning of the wafer test probe relative to the wafer to make contact with only a single die and then fully test the product. In a sense, die were tested entirely "in series".

By contrast, the presence of the clusters allows for the product die within a reticle, as well as within multiple reticles, to be tested "in parallel". Here, a wafer test probe whose landing head includes four test probe site interfaces can simultaneously make contact to each of the test probe sites within a cluster upon only a single landing of the head upon the wafer's surface. As such, time will be consumed in moving the positioning of the wafer test probe relative to the wafer for each "group of four" reticles on the wafer.

By so doing, time is only consumed moving the positioning of the wafer test probe relative to the wafer so as to make contact with each "group of four" reticles on the wafer; and then, simultaneously testing the group of four reticles that are joined by their test probe site clusters. Thus, after the product die of a first group of four reticles are simultaneously tested, the "four-headed" wafer test probe may move to the cluster of a next group of four reticles (e.g., four reticles whose product die have not yet been tested).

In the embodiment of FIG. 2, test probe sites are put in or near each reticle corner so that, for instance, some freedom exists with respect to the allowable patterns of hops between clusters over the surface of the wafer; and/or, to permit full testing of a reticle even though a test probe site within the reticle did not yield from the wafer's manufacture (i.e., with respect to the later point, essentially, 4:1 redundancy is "built into" each reticle to protect against manufacturing defects that impact a particular wafer test probe site's effectiveness).

Of course in alternate embodiments, the degree of redundancy may vary. For example, for design approaches that seek less redundancy, a reticle may be populated with only two or three test probe sites (which results in two or one more product die per reticle, respectively). Design approaches seeking no redundancy may populate a reticle with only one test probe site, or may choose to implement redundancy in the routing but not necessarily through multiple probe sites. Here, as the number of test probe sites per reticle drops below four, the location of the test probe site(s) should vary across reticles to promote the formation of clusters (e.g., of two neighboring reticles, a first leftmost reticle has a test probe site in an upper left corner but not an upper right corner; and, a second rightmost reticle has a test probe site in an upper right corner but not an upper left corner).

Recall from above that, in an embodiment, each test site within a reticle is wired to every product die within the reticle. This design point serves to further support the redundancy of multiple test probe sites per wafer. That is, for example, should a particular test probe site not yield, any single other test probe site can be used to fully test the reticle's product die.

Figure 3A:
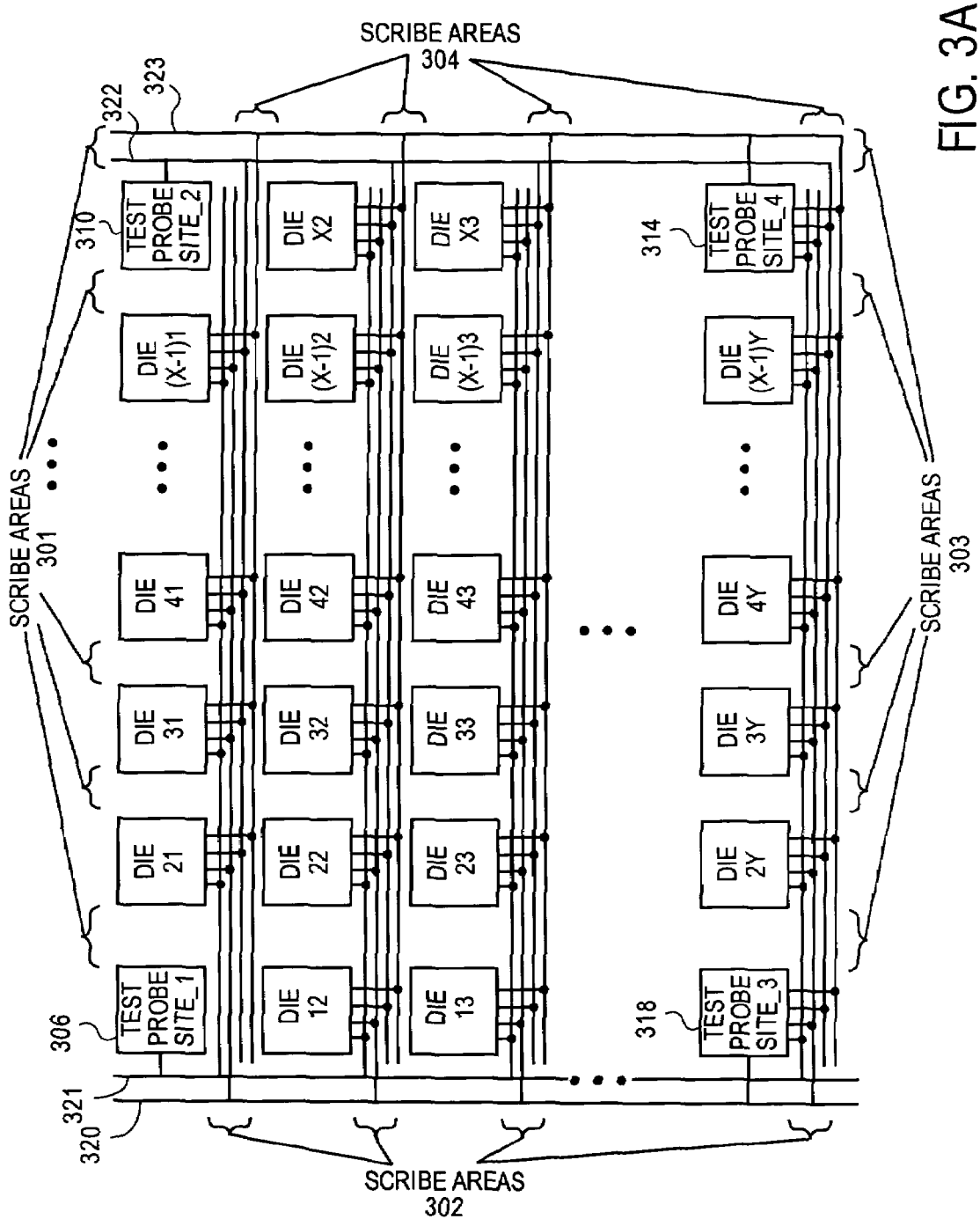
FIG. 3a shows another embodiment of a reticle design for a wafer that includes conductive traces for testing individual chips within the reticle that run through and across the reticle's scribe lines.

FIG. 3a shows an embodiment of a reticle design of X columns and Y rows having a test probe site 306, 310, 314, 318 in each corner of the reticle. The product die are labeled by their x,y (column, row) coordinate values. Each test probe site is separately wired to each product die through a dedicated bus. Optionally all busses may be made accessible at each probe site for further accesses to redundant data busses. That is, bus 321 is dedicated to the ability of test probe site 306 to communicate to each of the product die; bus 320 is dedicated to the ability of test probe site 318 to communicate to each of the product die; bus 322 is dedicated to the ability of test probe site 310 to communicate to each of the product die; and, bus 323 is dedicated to the ability of test probe site 314 to communicate to each of the product die. For simplicity each bus 320, 321, 322, 323 is drawn as a single wire. It should be understood that each bus typically includes multiple wires.

Importantly, the bus wiring is observed to run through the "scribe" regions of the wafer 301, 302, 303, 304. A wafer's scribe regions are areas of the wafer that are consumed when the wafer is "diced" into its individual die/chips. Here, a narrow saw blade creates a kerf between the die.

Routing the bus wiring 320, 321, 322, 323 between the multiple test probe sites 306, 310, 314, 318 and the product die along the wafer's scribe areas 301, 302, 303, 304 results in better design efficiency because little or no product die space is compromised. According to one embodiment, the wafer is fully tested before any scribing activity occurs. As such, the bus wiring 320, 321, 322, 323 should be fully intact and operable when on wafer testing takes place. After the wafer has been fully tested, the bus wiring 320, 321, 322, 323 is no longer of any use. As such, the destruction to the bus wiring 320, 321, 322, 323 by the scribing of the wafer is of no consequence.

Figure 3B:
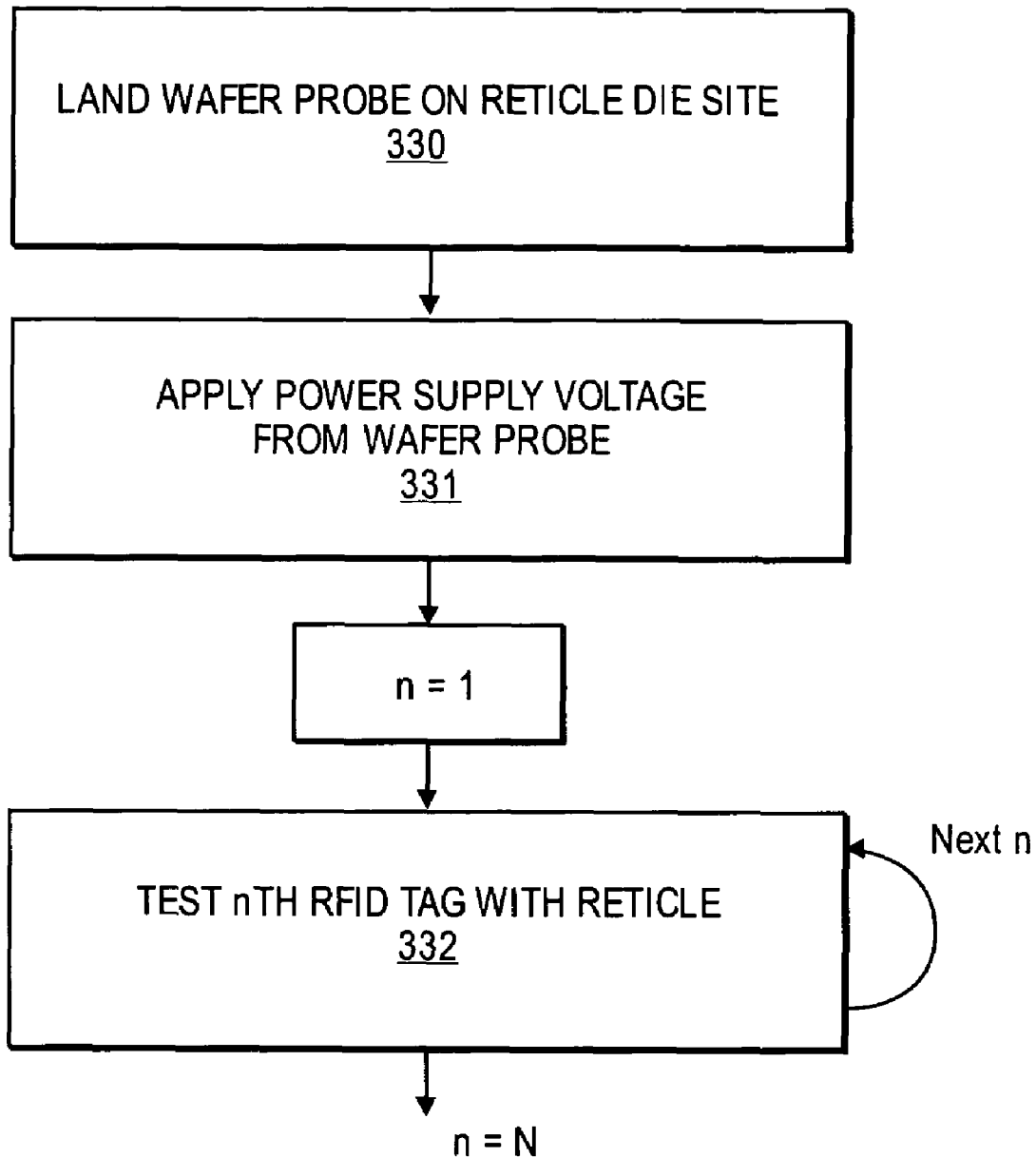

FIG. 3b shows a wafer test methodology that can be performed upon the reticle design of FIG. 3a. According to the methodology of FIG. 3b, a wafer probe lands on 330 one of the wafer probe test sites 306, 310, 314, 318. Then, each of the reticle's product die are "powered up" by the wafer tester through the wafer probe and test probe site that the wafer probe is in contact with 331 (e.g., a power supply voltage and ground reference are applied).

Then, functional testing commences. According to the approach of FIG. 3b, functional testing within the reticle may be performed serially (i.e., one die at a time) 332, or by additional parallelism in which the stimulus and correct response are provided and compared locally with the actual response. Here, the tester sends signals and commands from the wafer probe, through the test probe site that the wafer probe has landed on, over the bus to the "targeted" nth product die. The targeted die performs certain acts in response to the signals and/or commands. These acts (and/or the results thereof) are monitored by the tester via return signals/responses sent from the targeted die, over the bus wiring, through the test landed on test probe site, and into the wafer test probe. When the testing of the targeted die is complete, typically, the same set of signals/commands are applied to the next (e.g., n+1th) targeted die in the reticle. Once all product die in the reticle have been tested (e.g., n=N), the testing of the reticle is completed.

Importantly, recalling the discussion of FIG. 2 that pertained to the clustering of test probe sites, note that separate instances of the methodology of FIG. 3b can be simultaneously executed on neighboring reticles if the wafer test probe is positioned on a test probe site from each reticle in a cluster and is retrofitted to communicate with the die of multiple reticles in the same time frame. That is, for example, if four neighboring reticles are being tested at the same time, four separate instances of methodology 332 may overlap in time (e.g, with equal or unequal values of n).

FIGS. 4a through 4f show various designs for conductive traces that run through a reticle's scribe lines. Here, the conductive traces may correspond to any of the individual wires within any of the individual busses 320, 321, 322 and 323 discussed above in FIG. 3a.

An issue with running wiring through a scribe region is contamination of a product die's interconnect metallization. Contamination or corrosion of metal lines may result, for instance, simply by exposing it to an air medium at normal humidity and temperature levels. Thus, if the metal of a scribe region wire were physically in contact with the wiring of a product die, and if this metal were to be exposed to an air medium (a likely occurrence given that the scribe region wiring is apt to be severed in an air medium during the sawing process), contamination is apt to start at or near the severed end of the scribe wire and spread into the product die.

In order to avoid the introduction of a potential failure mechanism to the product die from the occurrence of the events described above, the designs outlined in FIGS. 4a through 4f effectively "embed" a conductive channel of a scribe region wire within the semiconductor substrate itself. The embedded conductive channel is positioned such that it is intersected by a line along which the wafer itself is scribed.

As such, when the wafer is scribed, a scribe region wire is severed along its embedded conductive channel rather than any metal conductor. Because the semiconductor wafer (which is typically made of silicon) does not contaminate (e.g., because it possesses a native protective oxide), the product die's metallization is effectively prevented from contamination by the embedded conductive channel even though the scribe region wiring was exposed to an air medium during the scribing process.

Figure 4A:
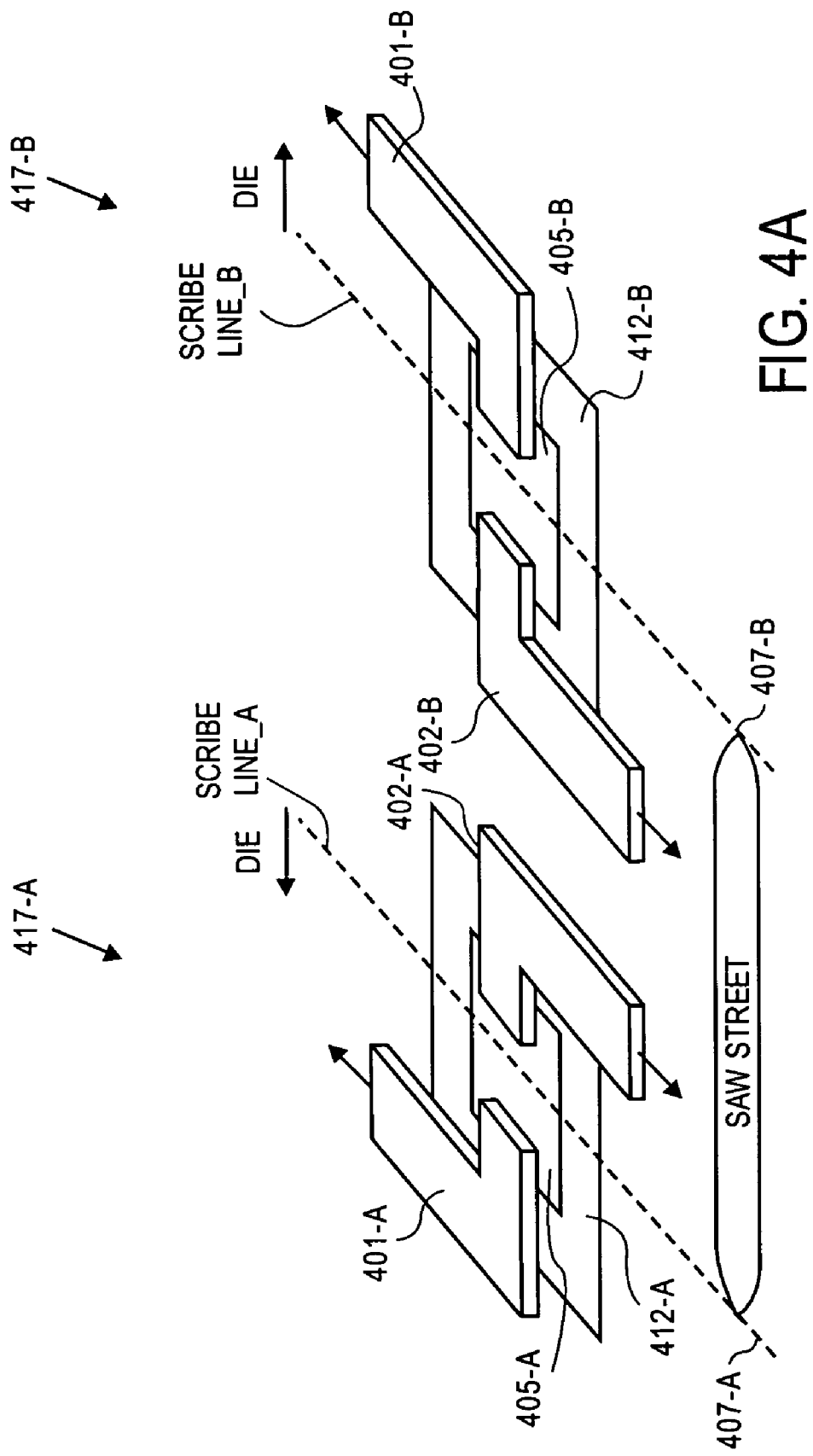
FIGS. 4a through 4f show various depictions of a design for conductive traces that run through a reticle's scribe lines.
Figure 4B:
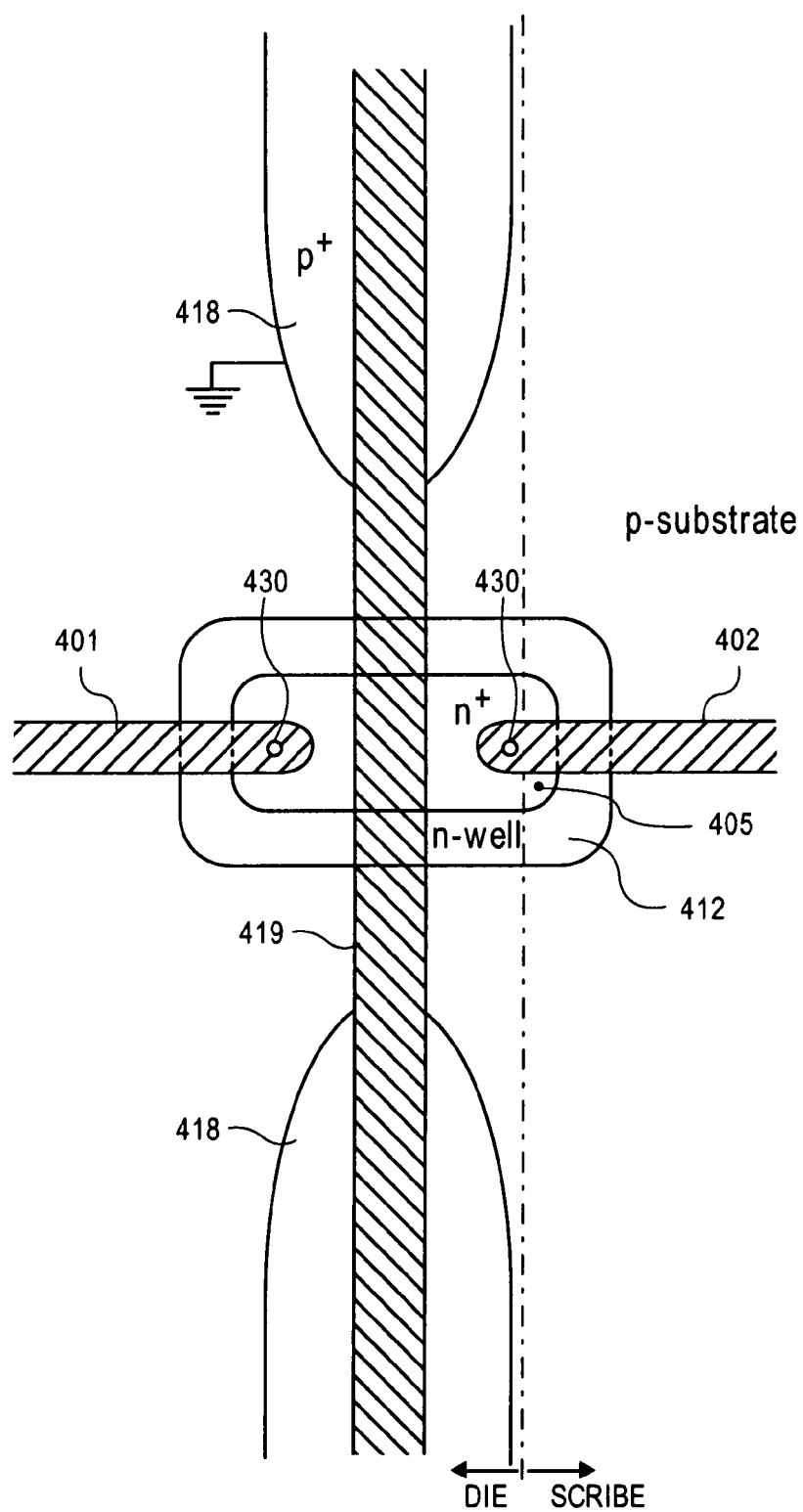
Figure 4C:
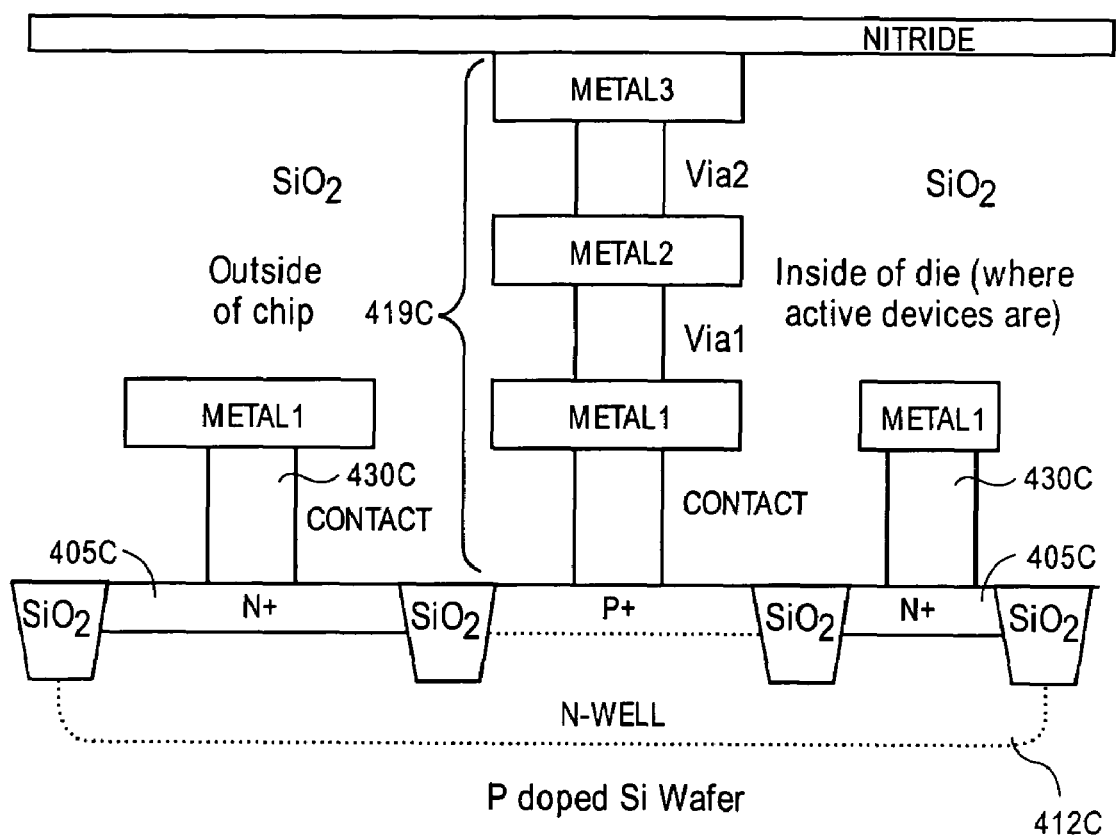

FIGS. 4a and, 4b show "pre-scribing" perspectives of scribe region wiring having an embedded conductive channel along a scribe line as described just above. For 4c shows a more detailed embodiment of the approach of FIGS. 4a and 4b showing field oxides (and having die seal contacts directly over the embedded on wafer testing channel). As such, FIGS. 4a, 4b and 4c show the wiring before the wafer has been scribed. FIG. 4a shows a three dimensional perspective of a pair of scribe region wires 417-A and 417-B that run to a pair of die (a first die on the left hand side of FIG. 4a and a second die on the right hand side of FIG. 4b). FIG. 4b shows a top view of wire 417-A of FIG. 4a. FIG. 4c shows a cross-section view.

Referring to FIG. 4a, each of the wires includes a respective conductive channel 405-A, 405-B that is embedded in the semiconductor wafer. Wire elements 402-A and 402-B run within the scribe region (between scribe lines 407-A and 407-B) that separate the neighboring die shown in FIG. 4a. Wire elements 402-A and 402-B can be viewed primarily as bus wires that run between their respective die and wafer test probe site. Wire elements 401-A and 401-B run into their respective product die. Each of wire elements 401-A, 401-B, 402-A and 402-B are implemented, in an embodiment, with the standard interconnect wiring metallurgy of the applicable manufacturing process.

Referring to wiring 417-A of FIG. 4a and 4b, wiring elements 401 and 402 are shown as standard interconnect metal having contacts (which may also be referred to as "vias") that drop down to the conductive channel 405. In the particular embodiments depicted in FIGS. 4b and 4c, the conductive channel is formed with regions 405, 412 (405c, 412c) of the semiconductor wafer that have been doped with donor atoms (n). Here, the n type conductive channel is formed with a well 412, 412c (an "n well") that has been doped with less donor atoms than the regions of the conductive channel 405, 405c directly beneath the contacts 430, 430c of the wiring. The n well 412, 412c essentially isolates the conductive channel from the surrounding region of the semiconductor wafer that has been doped with acceptor atoms (p type). Alternative substrate, well and/or conductive channel doping schemes can be readily configured by those of ordinary skill (including a reverse approach having a p well and p+contact regions).

FIGS. 4b and 4c in addition also show a ground trace 419, 419c (or "die seal") that runs over the conductive channel 405; this ground trace is not necessarily essential, but its use around the perimeter of the die can be customary, such that when tied to the otherwise high impedance substrate, differing substrate potentials from electrical switching noise can be avoided. The ground trace has not been drawn in FIG. 4a so that the underlying structures can be more easily seen. In an embodiment, the ground trace 419, 419c like wire elements 401 and 402, is formed with the standard metal interconnect technology of the applicable manufacturing process. As noted above, the ground trace 419, 419c is designed to be strongly tied to the silicon substrate via its connection through multiple contacts to p+ wells 418.

The multiple contacts observed in FIG. 4b essentially form a very low resistance between the ground trace 419 and the p+ well and p− substrate 418. The p well/substrate can be viewed as a ground node when the surrounding p substrate region itself is grounded.

Figure 4D:
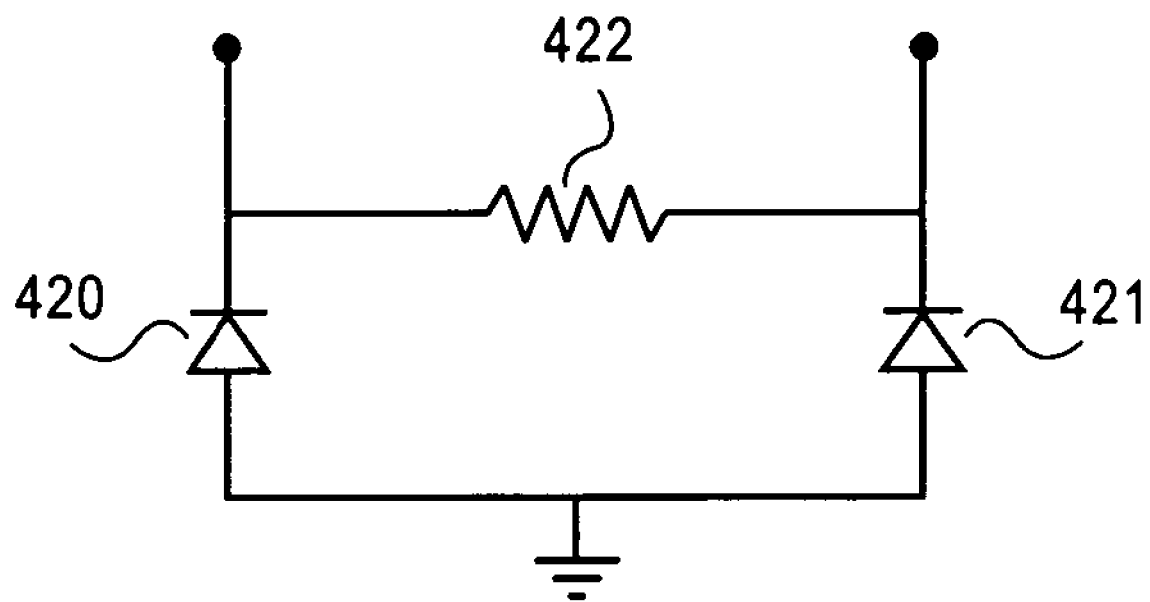

FIG. 4d shows an electrical circuit model for the wiring structure observed in FIGS. 4a, 4b and 4c. Here, the n type conductive channel corresponds to a small resistance 422; with the n well 412 and p type surrounding substrate activing as reverse biased diodes 420, 421 on each side of resistance 422. Grounding the surrounding p substrate as described above essentially corresponds to the anode of diodes 420, 421 being grounded. As such, under normal operating conditions where the scribe-and-break region wiring only receives voltage levels at or above ground, only a very small leakage current should ever flow from the conductive channel to the surrounding p substrate (i.e., diodes 420 and 421 are nominally "off").

Figure 4E:
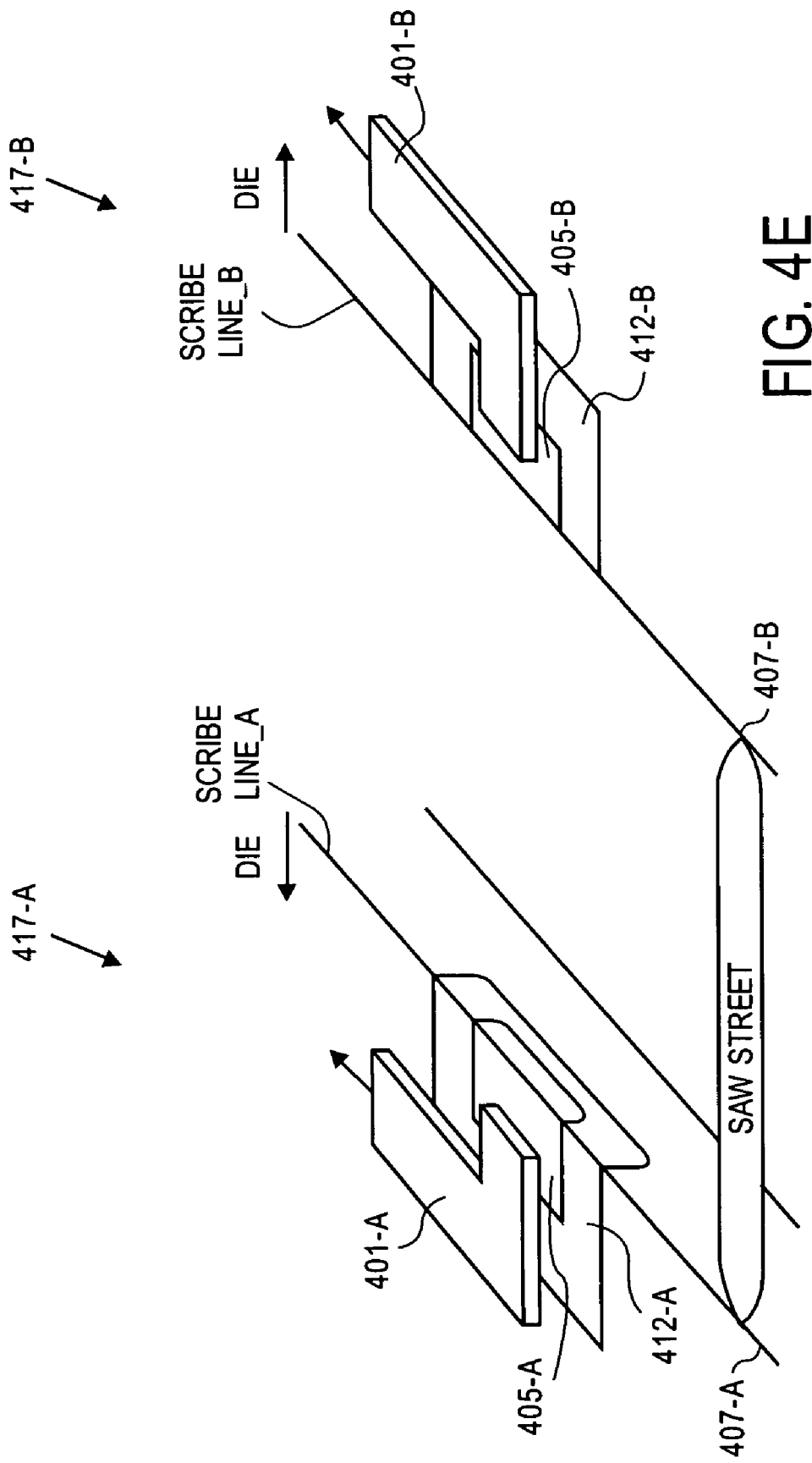
Figure 4F:
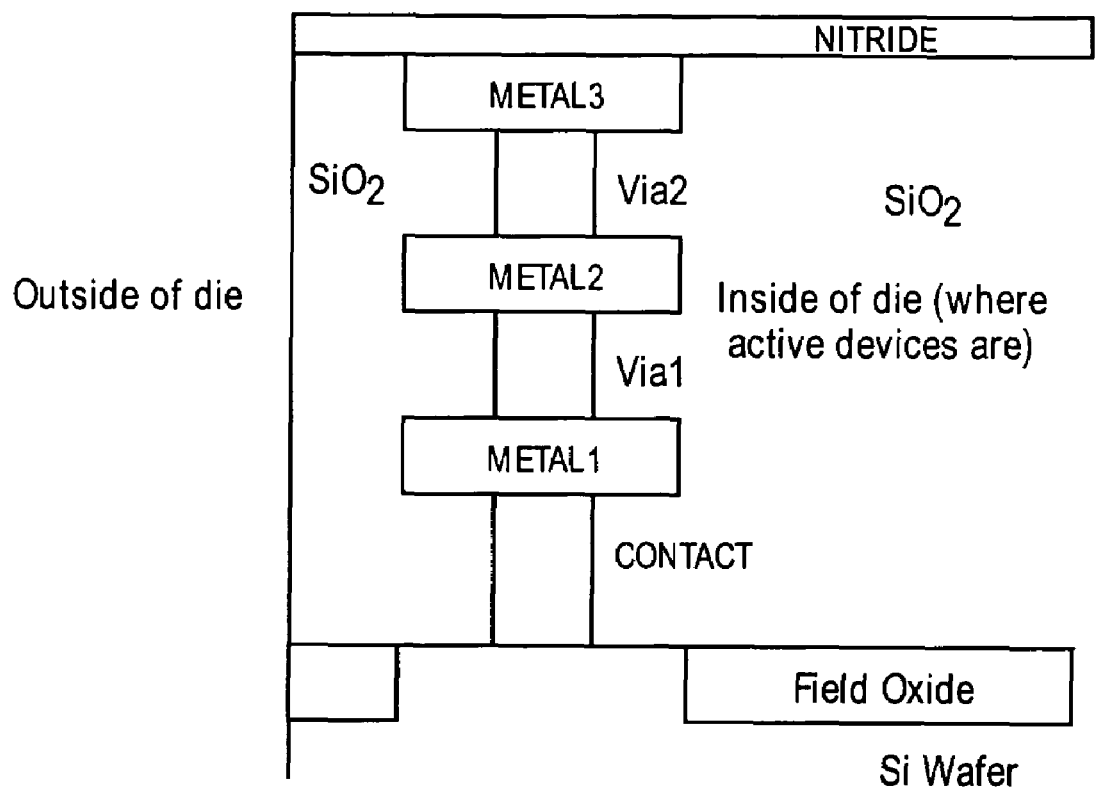
Figure 4F:
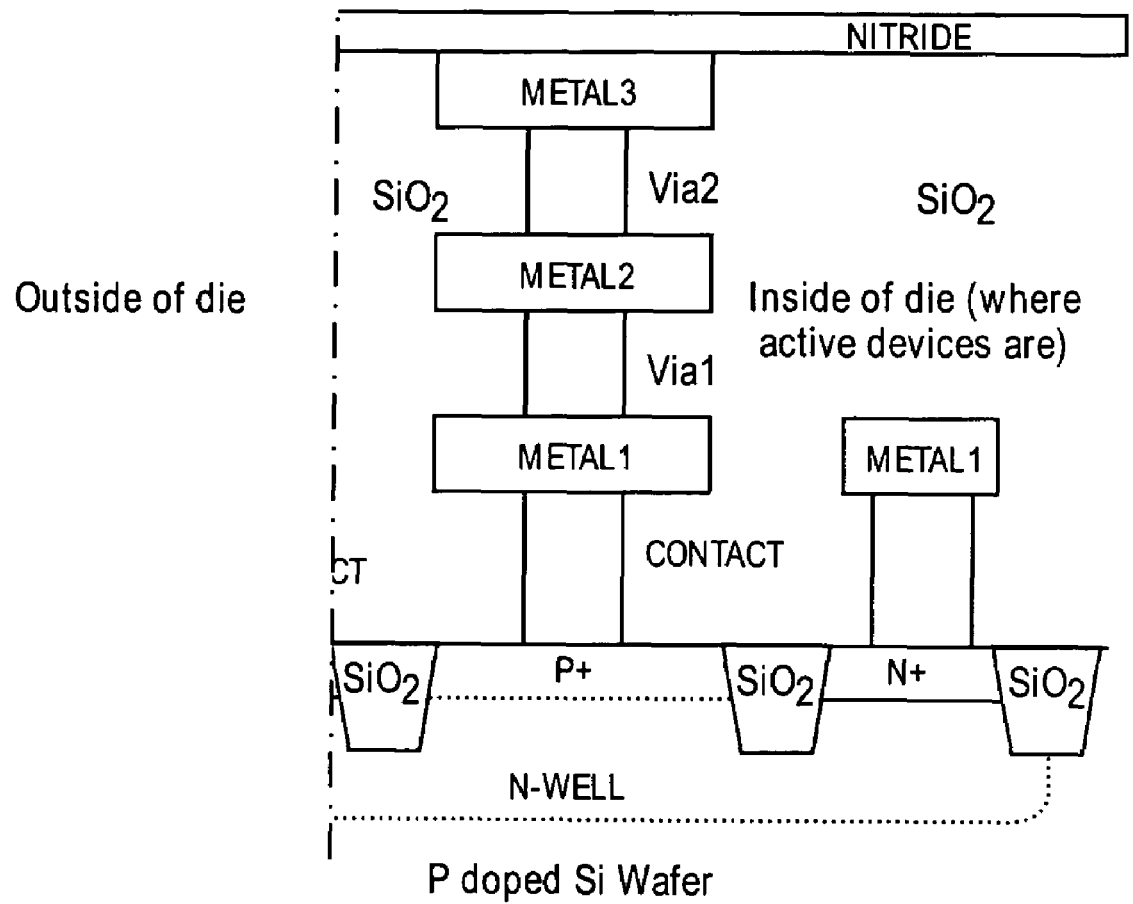

FIGS. 4e and 4f(b) show depictions of the structures depicted in FIGS. 4a and 4c, respectively, after the wafer has been scribed along scribe lines 407-A and 407-B. For comparison, FIG. 4f(a) shows the configuration that would exist without the embedded on wafer test wiring that is depicted in FIG. 4c. Note the exposure of only the embedded conductive channel 405 to any "air" that is present around the periphery of the die, making it no different from other exposed silicon edges. The metal wire element 401 is surrounded by insulation/passivation material so as to be effectively shielded from airborne contaminants. As such, contamination of the conductive trace whose edge resides at the edge of the die after scribing is avoided. Also, noise that is effectively received at the die edge by the conductive channel 405 should be attenuated through the capacitance formed with the ground wiring 419.

2.0 Die Design

Figure 5:
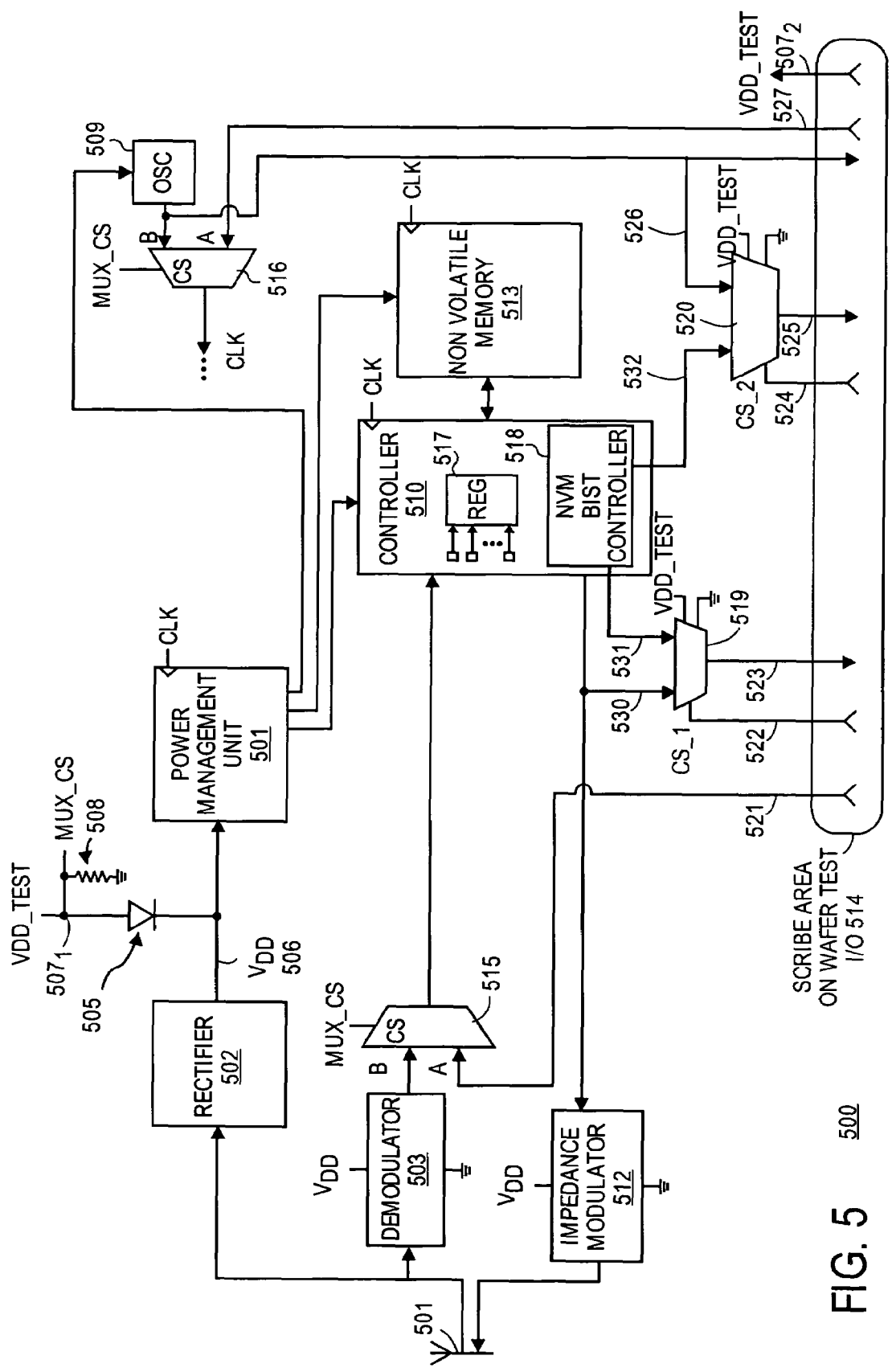
FIG. 5 shows an electrical design for an RFID tag capable of being functionally tested "on-wafer"

FIG. 5 shows a design for an RFID tag that is capable of being tested "on wafer". Here, as an example, the design observed in FIG. 5 may be instantiated in each of the product die observed in the reticle design of FIG. 3a. The circuitry that has been designed-in to support the on wafer testing, as will be described and emphasized in more detail below, has been minimized to impose only modest semiconductor surface area consumption. As discussed at length above at the onset of this detailed description, the less semiconductor surface area consumed by an RFID tag's circuitry for supporting on-wafer testing, the smaller the RFID tag becomes—resulting in potentially more RFID tags per wafer and therefore lower manufactured cost per RFID tag.

Moreover, the power consumption of the testing circuitry is designed to consume little (if any) power while the RFID tag is in service after manufacturing and test. Thus, because RFID tags are generally designed to be operational without receiving an external supply of power, any additional on wafer testing circuitry designed into an RFID tag should not only attempt to minimize surface area utilization but also attempt to minimize power consumption.

It should be appreciated that although the present description refers to an RFID tag, at least some of the techniques for implementing on wafer testing of individual die without prohibitively increasing surface area or power consumption may be applied to semiconductor die targeted for other applications (i.e., non RFID tag die).

Before further explaining some of the on wafer testability design efficiencies, however, an overview of the RFID tag design will first be provided. Recall that an RFID tag is a semiconductor chip that can positively respond to a wireless signal that inquires into its existence. Here, the wireless signal is received at antennae 501 and is converted into electrical signal(s) that are processed by rectifier 502 and demodulator 503.

The rectifier 502 forms a DC power supply voltage from an electrical signal received from the antennae 501 having time varying amplitude (i.e., the RFID tag is powered with energy carried by the wireless signal). The DC power supply voltage (VDD) is fed to a power management unit (PMU) 504 that regulates the power consumption of an oscillator 509, demodulator 511, micro-controller 510 and non-volatile memory 513 in light of the individual usage of each.

The oscillator 509 acts as the source for a clock signal that is supplied to other components within the RFID tag (most notably the micro-controller 510 and non-volatile memory 513). The demodulator (503) converts an electrical signal from the antennae 501 into a bit sequence. The bit sequence is set to the micro-controller 510 which interprets the bit sequence as commands.

Often, the command includes a unique identifying sequence and essentially requests the micro-controller 510 to compare this sequence received by way of the wireless signal with another pattern that is stored in the non-volatile memory 513. The ID tag stored in the non-volatile memory 513 corresponds to the ID of the RFID tag chip itself. The command received by way of the wireless signal essentially seeks to establish whether or not an RFID tag semiconductor chip having the pattern included in the command exists within range of the wireless signal.

Here, as is known in the art, electromagnetic waves (e.g., that are used to form the wireless signal) do not produce reflected energy if a receiving load (such as antennae 501) has an impedance that matches that of the medium over which the waves travel (e.g., 377 ohms in free space). According to one embodiment, the impedance of the antennae 501 is nominally designed to match the medium through which the wireless signals propagate. As such, under nominal conditions, the RFID tag is designed to not reflect significant electromagnetic wave energy back to the reader (e.g., an automated inventory tracking and management system) that is sending the wireless signal. Better said, the nominal design point of the RFID tag is to remain essentially invisible to the system that sends the wireless signal.

Accordingly, if the comparison does not result in a match (i.e., the RFID tag 500 of FIG. 5 is not the RFID tag the wireless signal seeks to confirm/deny the presence of), the micro controller 510 responds "negatively" by keeping the impedance of antennae 501 adjusted to its nominal design point (i.e., the RFID tag's antennae 501 does not reflect any energy causing the RFID tag to remain invisible to the system that is sending the wireless signal).

By contrast, if the comparison results in a match (i.e., the RFID tag 500 of FIG. 5 is the RFID tag that the wireless signal seeks to confirm/deny the presence of), the micro controller responds "positively" by adjusting the impedance of antennae 501 through impedance control unit 512. The change of impedance causes the antennae 501 to reflect energy back to the system sending the wireless signal so that the system can realize the presence of the sought-for RFID tag. In more sophisticated implementations, the micro-controller 510 can communicate messages back to the system by modulating the. antennae's impedance in this manner.

With an overview of the basic functions of the RFID tag 500 having been explained, a description of the circuitry used during on-wafer testing of the RFID tag is now in order. To first order, electrical "I/O" signals 514 sent from the tester over the scribe region wiring are used to "emulate" a signal sent from demodulator 503. That is, wireless signals are not received at antennae 501. Nevertheless, because the demodulator is downstream from the antennae 501, it may be said that the electrical signal from the tester also emulates a signal that originates from the antennae 501.

If the RFID tag is to be tested in this manner, a DC power supply voltage needs to be directed to the RFID tag 500 (because the RFID tag 500 cannot generate power from rectifier 502 if a signal is not being received at antennae 501). Here, the VDD_Test $507_{1,2}$ input is used to supply the RFID tag's power consumption during its on-wafer test. The power received at the VDD_Test $507_{1,2}$ input is also supplied by the tester through the scribe wiring. According to the design approach of FIG. 5, this "artificial" power supply voltage is applied to the anode side of a diode 505 whose cathode side is coupled to the RFID tag's power supply rail VDD 506 at the rectifier 502 output. As such, the RFID tag's rectifier 502 is bypassed during the on-wafer test.

Multiplexers 515, 516, 519 and 520 are embedded in the RFID tag design to promote on-wafer testing. Multiplexers 515 and 516 have their channel select input coupled to the VDD_Test node $507_{1,2}$ which itself is pulled down by a resistor (or active device) 508. When the artificial supply voltage is applied at the VDD_Test node $507_{1,2}$, each of the channel select inputs for multiplexers 515 and 516 are in a "logic high" state. According to the design embodiment of FIG. 5, this forces multiplexers 515 and 516 to select "channel A" during on wafer test.

During in seervice operation of the RFID tag 500 (i.e., after its manufacture and test), the VDD_Test node $507_{1,2}$ is left "open" because the scribe process creates an open circuit at the die edge 514 where the VDD_Test voltage is received, and, resistor 508 pulls down its potential to approximately ground (i.e., a logic "low"). As such, during in the field operation of the RFID tag 500, the channel select of multiplexers 515 and 516 are configured to select "channel B". Thus, each of multiplexers 515 and 516 are configured to select channel A during on-wafer test and channel B during in-service operation.

In an alternative approach the channel select of multiplexers 515 and 516 could be tied to a separate ground line supplied by the tester, which is left open by the scribe process. By coupling this ground line to a passive pull-up resistance connected to VDD, a logic high channel select value will occur during in the field operation and a logic low channel select value will occur during on-wafer test. The channel select multiplexers 515, 516 can also be implemented as an OR gate.

Channel A of multiplexer 515 is coupled to test signal input 521. Test signal input 521 transports the aforementioned input signal provided by the tester that emulates a wirelessly received signal. Here, the tester could send a signal that represents a packet containing some command to be performed by the micro-controller 510 (e.g., read non volatile memory command). The signal would be received at input 521 and would flow to the channel A input of multiplexer 515. In wafer test mode, channel A of multiplexer 515 is "selected". As such the signal sent by the tester would be forwarded to channel A of multiplexer 515.

Modulation is a form of signal encoding that prepares a signal carrying data for travel. A demodulator effectively reverses the modulation process so as to re-create the original signal prior to its modulation. The tester supplies the demodulated signal to the controller. The micro-controller 510 ultimately receives the demodulated version of the signal send by the tester to input 521 and interprets any command or instruction included therein.

Note that the micro-controller includes an ID register 517 whose data content is established by a specific combination of pull-up/pull-down resistances. In an embodiment, such as an embodiment that conforms to the reticle design of FIG. 3a where multiple product die are coupled to the same bus, at least in order to send an initial command to a particular product die, the tester has to uniquely identify the particular product die.

ID register 517 is used for this purpose. ID register 517 is designed to have a value that is a function of its corresponding die's location within its reticle. For example, for the approach of FIG. 3a, a unique register value may be assigned for each unique x,y location. By designing a micro-controller to respond to a signal that includes the content of its ID register 517, the tester supplied signals need only include a targeted product die's ID register contents in order to specifically communicate to the targeted die. Although in a bussed system as depicted in FIG. 3a the tester signal will reach the micro-controller of every die in the reticle, only the targeted die will respond because of the match between its register ID 517 contents and the identifier provided in the signal supplied by the tester.

In one embodiment, the tester is designed to tell a targeted die to write an identifier value into the non-volatile memory 513. Once an identifier value has been written into the non-volatile memory 513, the RFID tag 500 will behave as it should in service. That is, nominally, the RFID tag is designed to have its ID value "programmed" into the non-volatile memory 513. Once the tester has programmed an ID value into the non-volatile memory 513, the RFID tag 500 can be more fully tested against the acts it is expected to perform in service.

A good example is a test in which the tester sends a signal through input 521 that includes an identifier that the micro-controller 510 will compare against the identifier stored in the non volatile memory 513. If the micro-controller 510 finds a match, the micro-controller is expected to send a signal to the impedance modulator 512 that causes it to change its impedance. Note that the input 530 to the impedance modulator 512 is also coupled to an input channel of multiplexer 519.

Thus, with the tester's selection of this channel (via input 522 from the scribe-and-break region bus), the tester can test whether or not the micro-controller 510 is capable of: 1) identifying a match between an ID value that is received through the demodulator 511 and an ID value stored in non volatile memory 513; and, 2) in response to such a match, generating the appropriate input signal to the impedance modulator 512 (which is sent to the tester through multiplexer 519 and its output 523) that causes the antennae 501 to sufficiently change its impedance. This essentially corresponds to testing the basic function of the RFID tag itself.

Figure 6:
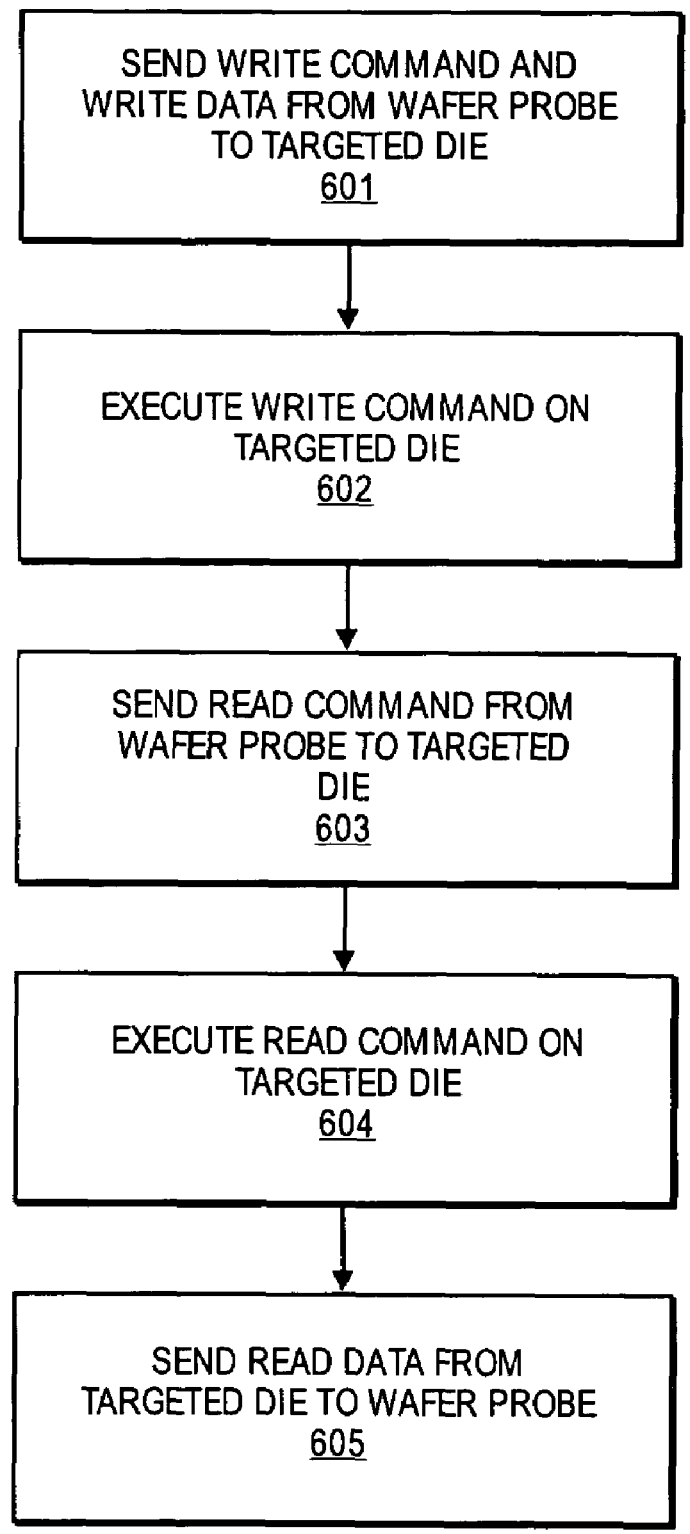
FIG. 6 shows an "on-wafer" testing methodology that can be performed with the RFID tag of FIG. 5.

A methodology for another test is outlined in FIG. 6. The methodology of the test observed in FIG. 6 is determines whether the RFID tag 500 can successfully write and read information to and from the non volatile memory 513. First, the tester sends 601 a write command and write data through input 521. The write command and write data flows through demodulator 511 and into micro-controller 510. The micro-controller 510 interprets the command and writes 602 it into the memory 513.

Then, the tester sends a read command 603 through input 521. The micro-controller interprets the read command and reads 604 the previously written 602 data from the memory 513. The data that is read from the memory 513 is then sent 605 to the tester via micro-controller output 531, multiplexer 519 and output 523. If the tester receives the same data that was written, correct write and read operation is verified.

In another test, the non-volatile memory 513 can be tested for manufacturing defects with an embedded non volatile memory (NVM) built-in-self-test (BIST) controller 518. Details of various BIST testing possibilities are provided in more detail below in section 3.0 "Built-In-Self-Test (BIST) ". However, note that in the particular embodiment of FIG. 5, the NVM BIST controller 518 has a pair of outputs 531 and 532.

Here, one output (e.g., output 531) is used to signify an error in the execution of a BIST test; and, the other output (e.g., output 532) is used to signify successful completion of a BIST test. Thus, during a BIST test, the tester configures multiplexers 519, 520 to respectively select NVM BIST controller 518 outputs 531 and 532 (via multiplexer channel select inputs 522 and 524, respectively). If there is a problem, multiplexer output 523 is activated by the controller 518. If the test is successful, multiplexer output 525 is activated by the controller 518.

As discussed above, multiplexer 516 is configured to force selection of channel A during on wafer test and force selection of channel B during nominal operation. Thus from the schematic of FIG. 5, during on wafer test, the RFID tag is driven by a tester supplied clock signal via input 527. Proper operation of the RFID tag's oscillator 509 is verified during on wafer test through the tester's selection of the input channel of multiplexer 520 that is coupled to the output of the RFID tag's oscillator 509.

Before moving on to a discussion of the NVM BIST controller 518, note that each of signal lines 521, 522, 523, 524, 525, 525 and power supply line 527 are essentially I/Os 514 that are associated with the scribe bus. As such, each of these lines will become open circuits after the RFID tag die 500 is scribed from the wafer.

All the test described are examples of a specific embodiment. In general the tester may send any arbitrary sequence to the tag. Also the tag may be configured with other multiplexers to return any desired signal, including analog signals if desired, to the tester. With these techniques any desired degree of test coverage and operability may be obtained.

3.0 Built-In-Self-Test (BIST)

As noted above, the size of an RFID tag should consume as little semiconductor surface area as is practicable. Nevertheless, robust on wafer testing should include thorough testing of the non-volatile memory 513. Memory testing generally involves writing test data into the memory 513, reading the written test data back from the memory 513 and comparing it against its expected value. Typically, in order to be thorough, test data is written into each memory address (to ensure each address is functional).

Because each address location is accessed, however, thoroughly testing a memory can be time consuming. As such, the micro-controller 510 of FIG. 5 includes an embedded non-volatile memory (NVM) built-in-self-test (BIST) controller 518. By incorporating a BIST controller 518 within the RFID tag itself, the memory testing function is distributed across the wafer die rather being centrally controlled. As such, the non-volatile memory of multiple RFID tags can be simultaneously tested on the wafer (by running the BIST controller of each of a plurality of RFID tags simultaneously) so as to reduce overall testing time as compared to a centralized testing approach.

The BIST controller 518 includes logic circuitry that generates data patterns which are written into the non-volatile memory 513. The data patterns are then read from memory and compared against their expected values. Any discrepancies between a read memory value and its expected value is flagged as an error. The BIST controller 518 also includes logic circuitry for the comparison and flag functions described just above.

Figure 7A:
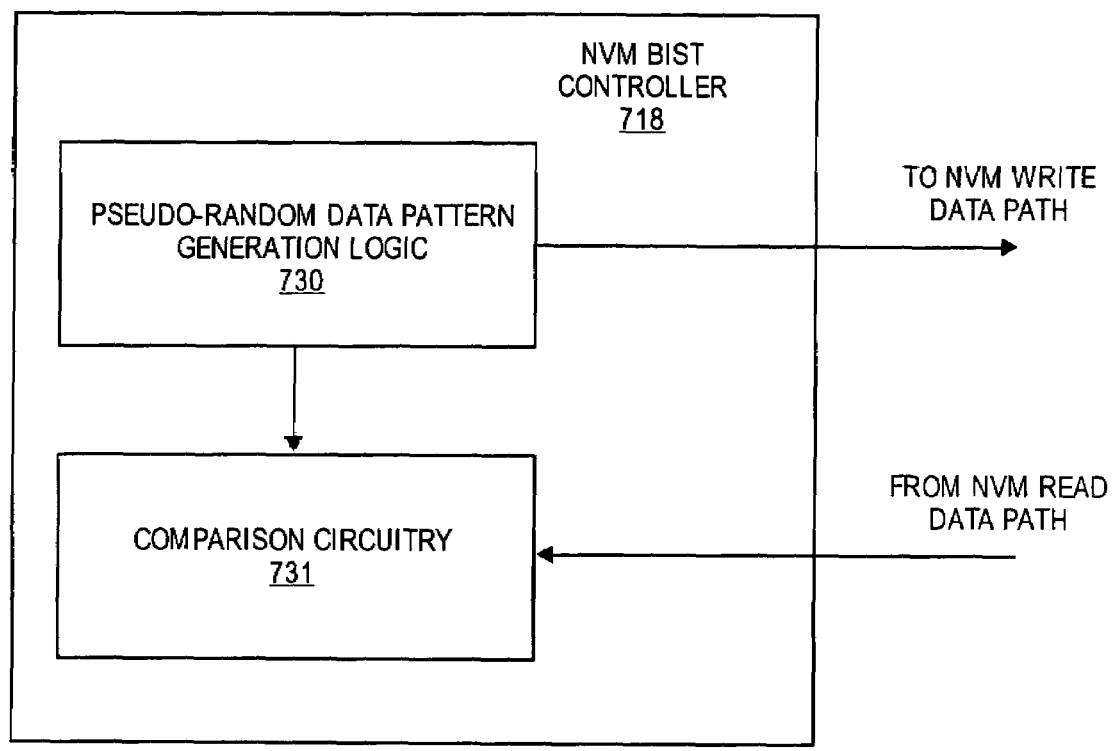

In an embodiment, referring to FIG. 7*a*, in order to keep the semiconductor surface area consumption of the BIST controller 718 low, the BIST controller uses a pseudo random pattern as a basis for generating the test data patterns. Mathematically, each test pattern can be viewed as an output value from a pseudo random pattern equation. Because pseudo random pattern equations can be simple to implement, the pseudo-random data pattern generation logic circuitry 730 need only include a relatively small amount of logic circuitry to generate the test data values.

Note that the pseudo-random data pattern generation logic is coupled to the comparison logic circuitry 731 that compares read test values against their expected value (e.g., the logic circuitry that implements the pseudo random pattern equation is also used to generate the expected value used by the comparison logic circuitry 731 for each read data value).

Figure 7B:
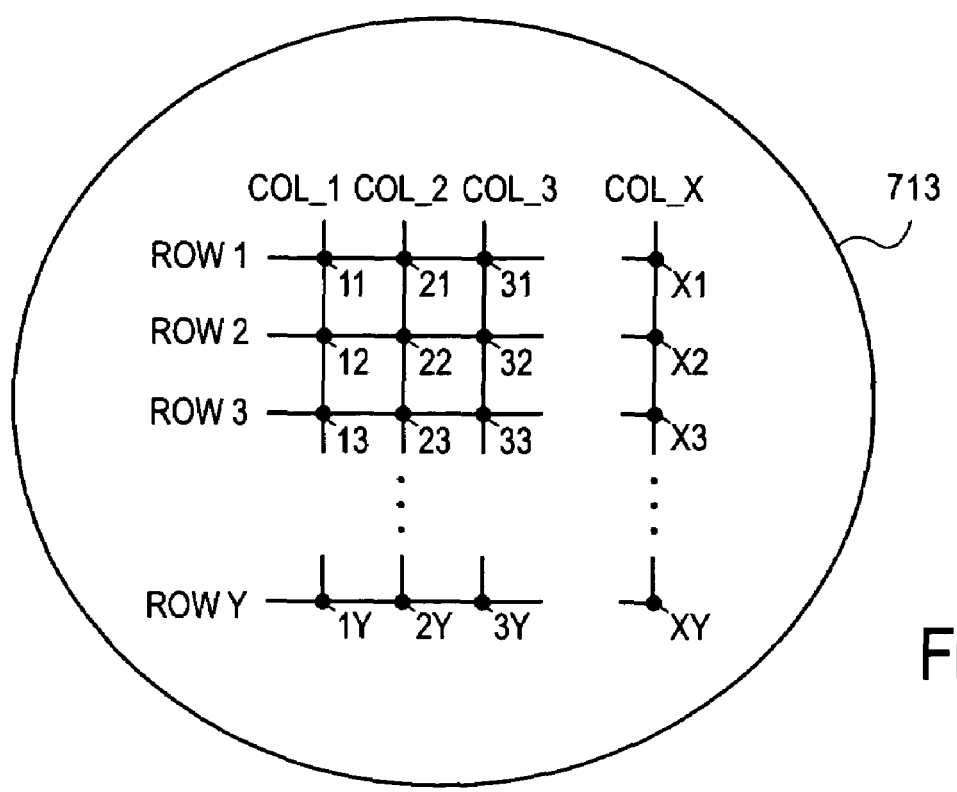

FIG. 7*b* shows a depiction of the architecture for a memory 713 such as non-volatile memory 513 of FIG. 5. The architecture shows an array of memory cells each having a specific row and column location. Each specific row and column location corresponds to a unique address that can be presented to the memory. A memory can have various functional failure mechanisms, at least some of which stem from the electric fields emanating/terminating from/at neighboring or proximate storage cells as a function of the data they contain. That is, certain data patterns held amongst a family of proximately located cells are more prone to cause at least one of the storage cells to "flip" one or more of its stored bits. Specific details concerning the ability of a pseudo-random pattern to provide sufficient coverage of these patterns is provided in more detail below with respect to FIGS. 7*d* and 7*e*.

Figure 7C:
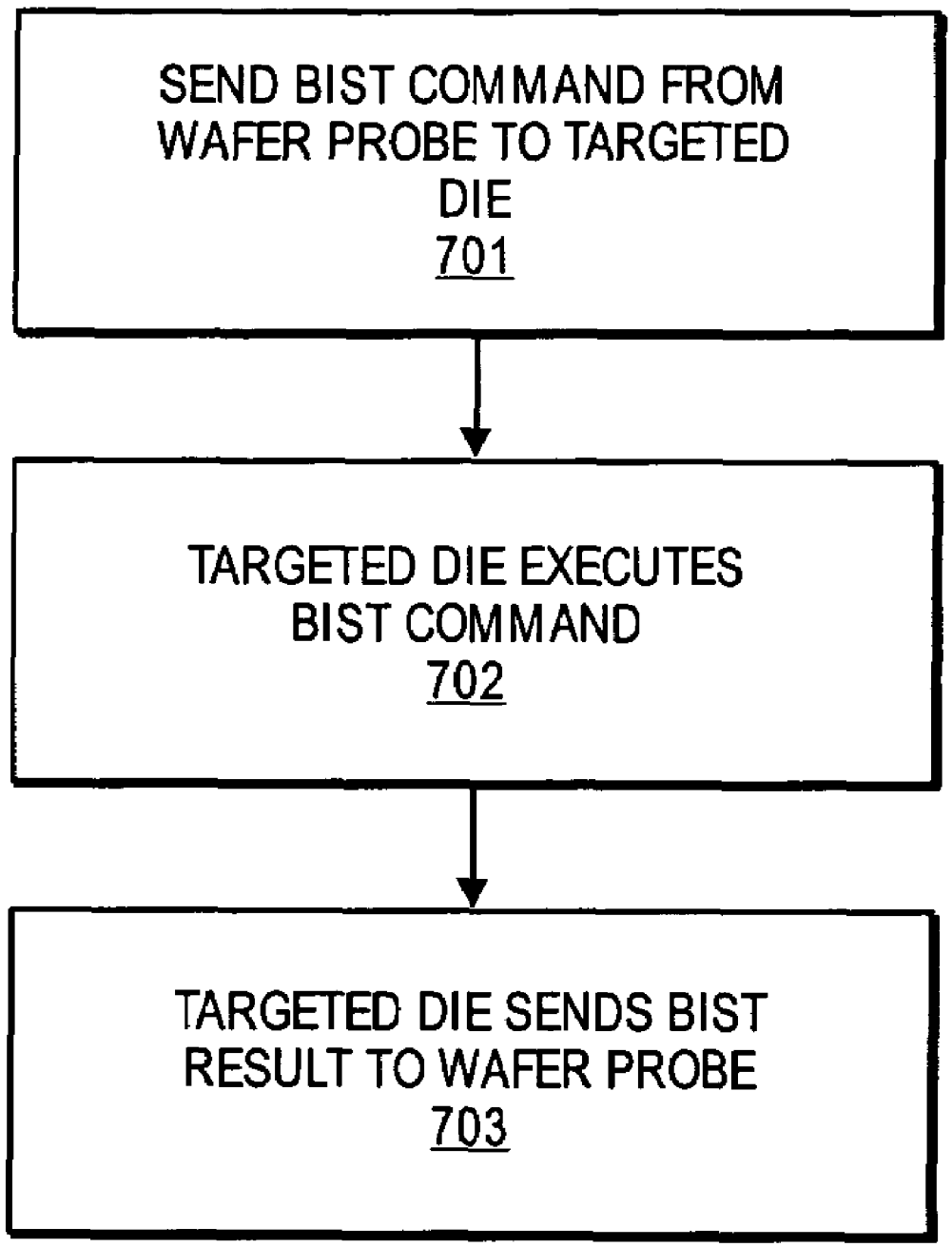

FIG. 7*c* shows a method that can be performed by an on wafer RFID tag, such as the RFID tag of FIG. 5, that includes an embedded BIST controller and is in communication with a wafer tester (e.g., through a bus routed along the wafer's scribe-and-break regions). According to the methodology of FIG. 7*c*, the wafer tester sends a BIST command through the wafer test probe toward a targeted die on the wafer 701. The BIST command can be, for instance, a command to generate test values with a pseudo-random pattern generator and write them into the non-volatile memory.

Then, the targeted die 702 (specifically, the BIST controller) executes the command. For example, continuing with the above example, the BIST controller will generate random patterns and write them into the non-volatile memory. The targeted die then sends a result or response to the tester. For example, referring to FIG. 5, if the test data is properly generated and written into the non-volatile memory 513, outputs 532 and 525 are activated (or, if a problem arises, outputs 531 and 523 are activated). Another process of FIG. 7*c* may then be performed to read the written data from the non volatile memory and report the result to the tester (e.g., the tester sends a "read and compare" command to the BIST controller 701; the BIST controller reads the test data and compares it against its expected values 702; and, the BIST controller indicates whether all the data matched (via outputs 532 and 525) or whether all the data did not match 703 (via outputs 531 and 523).

Recall from the discussion above that a memory can have various functional failure mechanisms, at least some of which stem from the electric fields emanating/terminating from/at neighboring or proximate storage cells as a function of the data they contain. In order to thoroughly stress any semiconductor memory, different combinations of data patterns are warranted because particularly troublesome data patterns may not be predictable a priori depending on manufacturing tolerances.

Figure 7D:
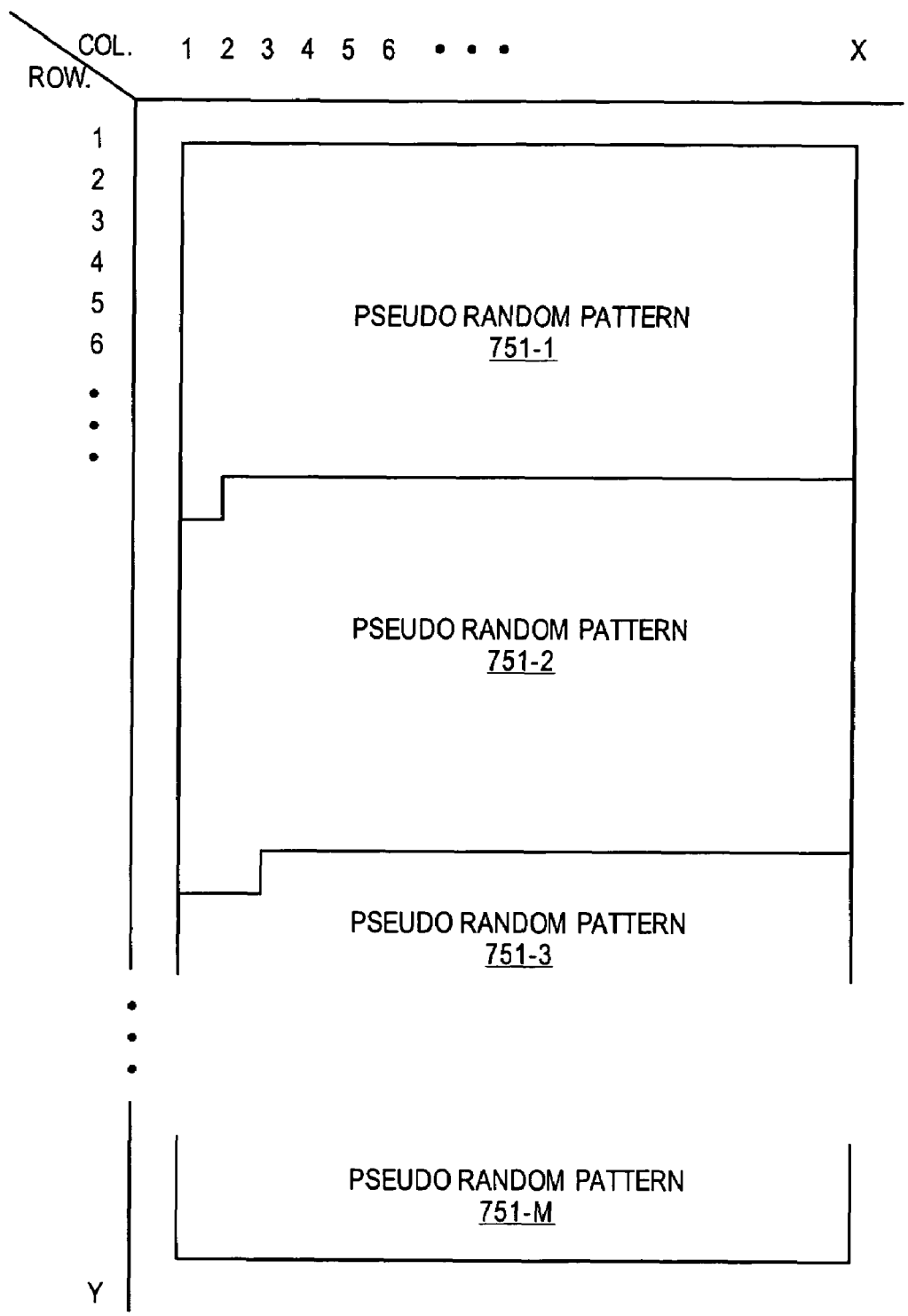
Figure 7E:
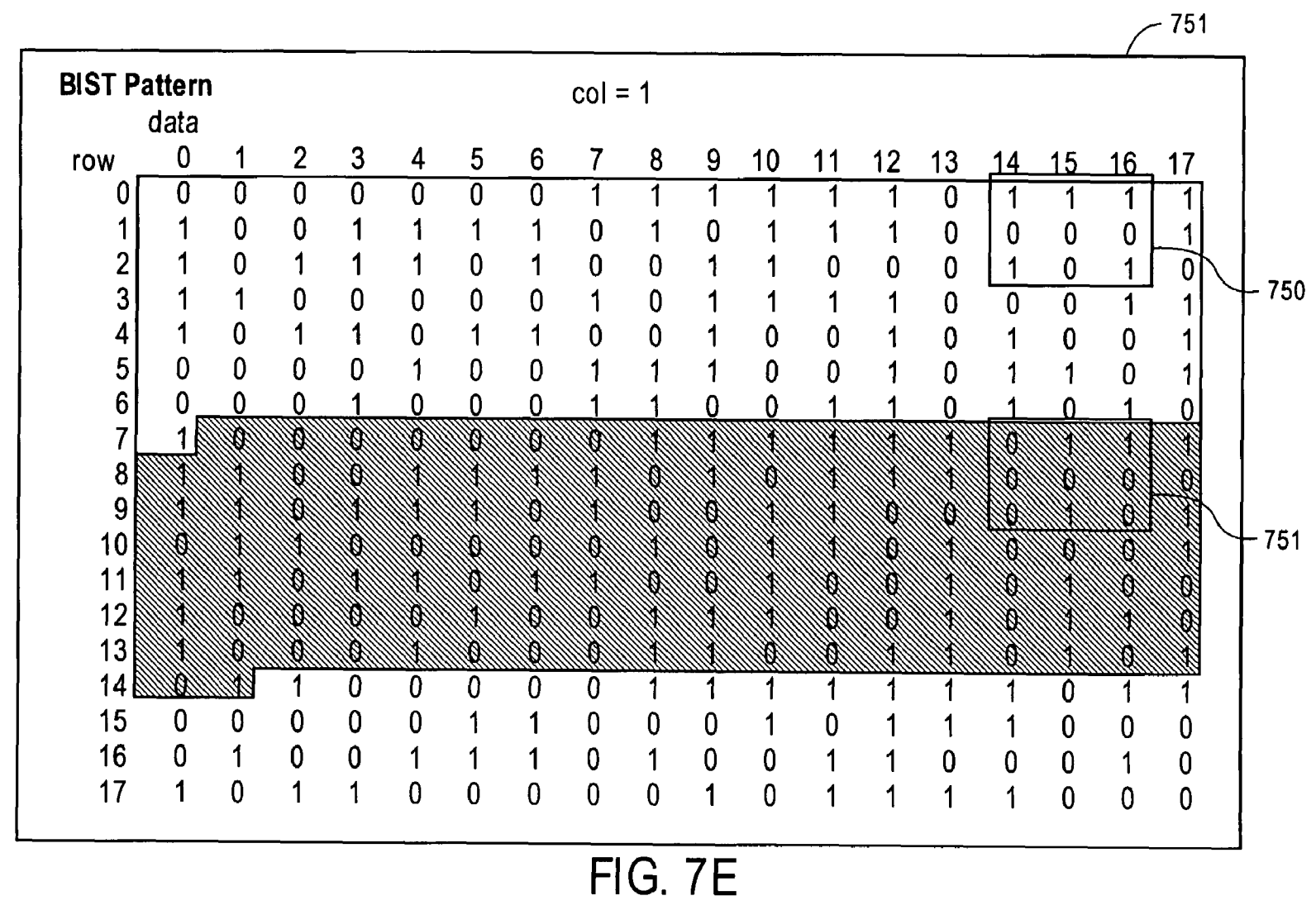

FIGS. 7*d* and 7*e* reveal that using a pseudo random pattern in a "non-aligned" manner with respect to the rows and columns of the non volatile memory can be used to provide a vast, if not exhaustively complete, number of proximate cell data pattern combinations. By having such pattern combinations, the cells of the non-volatile memory will experience varied electric field emanation/termination conditions (e.g., a first cell will have a first electric field emanation/termination condition, a second cell will have a first electric field emanation/termination condition, etc.) both statically (while the memory is holding its contents) and dynamically (while the memory is being read and written).

Moreover, the ability to generate varied electric field emanation/termination conditions from cell to cell is achieved at the expense of only a small amount of logic circuitry owing to the simplicity of generating psuedo random patterns as discussed above. The "non alignment" can also be achieved with relatively simple logic circuitry as well. As such, robust testing is achieved at the expense of relatively small semiconductor surface area.

Referring to FIG. 7*d*, multiple pseudo random data patterns 751-1, 751-2, 751-3, . . . 751-M are written across the columns of the non volatile memory. That is, a first pseudo random pattern 751-1 is written across a first set of rows and columns of the non volatile memory, a second pseudo random pattern 751-2 is written across a second set of rows and columns of the non volatile memory, etc. The patterns are written such that a "next" pattern starts at both a different row and a different column location than its predecessor pattern.

In the depiction of FIG. 7*d*, the pseudo random data patterns clearly end at different row locations (i.e., the data can be viewed as being written continuously across the columns of a row before moving on to the next row). However, the further condition that a next pattern end at a different column location than its predecessor causes neighboring patterns to be "non aligned" with respect to each other such that each subsequent random data pattern ends one further column out than its predecessor random data pattern. Specifically, pattern 751-1 ends at column 1, pattern 751-2 ends at column 2, etc.

The non alignment has the effect of scrambling or mixing the proximate cell data pattern combinations such that a large number of different combinations can be achieved with a psuedo random pattern that is significantly smaller than the overall memory capacity of the non-volatile memory itself.

FIG. 7e shows an example of a non-volatile memory having one row and eighteen columns; where, each cell is designed to store eighteen bits. The first data pattern starts at row 0 and data bit 0 and ends at row 7 and data bit 1. Window 750 shows a first combination of data surrounding a center data value of 0. Window 751 shows second combination of data surrounding a center data value of 0. Comparison of the specific data patterns within the windows 750, 751 reveals them to be different.

Thus, the potential failure mechanisms being tested for are different. This corresponds to robust testing because different stress conditions are being created. By contrast, if the first pseudo-random data pattern were aligned with the second (i.e., if the first pseudo-random data pattern ends at row 6 and data bit 17), the data pattern within window 750 would not only be found at window 751, but also repeatedly through the body of the memory at the same relative location of each subsequent data pattern. This would correspond to less robust testing because there would be fewer unique test patterns being written into the memory.

A similar effect can be gained by making the length of the pseudo-random pattern (in terms of the number of bits) to be greater than the number of bits that can be stored along one or more columns—but at a value that does not cause alignment of neighboring runs of the pseudo random data pattern. Here pieces of the pseudo-random pattern would be stored at each bit cell.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a semiconductor chip for an RFID tag comprising a receive signal path that flows from one or more primary inputs to a controller, said receive signal path to process an electrical receive signal originating from said inputs as a consequence of said inputs having received a signal from an antenna, a second signal path flowing into said receive signal path from a die edge of said semiconductor chip, said second signal path to transport an electrical test signal that emulates said receive signal while said semiconductor chip is being tested on wafer, said receive signal path flowing through both a first input of a multiplexer circuit and said multiplexer circuit's output, said multiplexer circuit having a second input coupled to said second signal path.

2. The apparatus of claim 1 wherein the said multiplexer circuit includes an OR gate.

3. The apparatus of claim 1 wherein said second signal path traces back to an open circuit, said open circuit caused by the scribing of said wafer.

4. The apparatus of claim 3 wherein, at the region of said open circuit, said signal path flows through said semiconductor chip's semiconductor substrate prior to being opened as a result of scribing each individual die from the wafer.

5. The apparatus of claim 1 wherein said signal selection circuit has a channel select input, said channel select input coupled to any of:
a passive pull-up resistor,
a passive pull-down resistor,
an active pull-up device,
an active pull-down device to cause said channel select input to have a first state while said semiconductor chip is being tested on wafer and a second state while said semiconductor chip is receiving said signal from said antenna.

6. The apparatus of claim 1 wherein said semiconductor chip further comprises a rectifier coupled to at least one of said inputs, a node where a supply voltage for said semiconductor chip is to appear residing downstream from an output of said rectifier, a diode's cathode coupled to said node, said diode's anode coupled to wiring that provides said semiconductor chip's supply voltage while said semiconductor chip is being tested on wafer.

7. An apparatus, comprising:
a semiconductor chip for an RFID tag comprising a receive signal path that flows from one or more primary inputs, said receive signal path to process an electrical receive signal originating from said inputs as a consequence of said inputs having received a signal from an antennae, said semiconductor chip further comprising a rectifier coupled to at least one of said inputs, a node where a supply voltage for said semiconductor chip is to appear residing downstream from an output of said rectifier, a diode's cathode coupled to said node, said diode's anode coupled to wiring that provides said semiconductor chip's supply voltage while said semiconductor chip is being tested on wafer.

8. The apparatus of claim 7 wherein said semiconductor chip further comprises a multiplexer to multiplex between test signals generated while said semiconductor chip is being tested on wafer, said multiplexer having its power supply node coupled to said wiring.

9. The apparatus of claim 7 further comprising a second signal path flowing into said receive signal path from a die edge of said semiconductor chip, said second signal path to transport an electrical test signal that emulates said receive signal while said semiconductor chip is being tested on wafer, said receive signal path flowing through both a first input of a multiplexer and said multiplexer's output, said multiplexer having a second input coupled to said second signal path, said multiplexer's channel select input coupled to any of:
a passive pull-up resistor;
a passive pull-down resistor,
an active pull-up device;
an active pull-down device;
to cause said channel select input to have a first state while said semiconductor chip is being tested on wafer and a second state while said semiconductor chip is receiving said signal from said antenna.

10. The apparatus of claim 7 wherein said receive signal path flows to a controller.

11. The apparatus of claim 10 wherein said controller is coupled to a non-volatile memory.

12. An apparatus, comprising:
a semiconductor chip for an RFID tag comprising a receive signal path that flows from one or more primary inputs, said receive signal path to process an electrical receive signal originating from said inputs as a consequence of said inputs having received a signal from an antenna, said semiconductor chip also comprising a test signal path to transport a test signal while said semiconductor chip is being tested on wafer, said test signal path tracing from, or back to, an open circuit residing within the semiconductor substrate of said semiconductor chip, said open circuit caused by the scribing of said wafer.

13. The apparatus of claim 12 wherein said semiconductor chip further comprises a rectifier coupled to at least one of said inputs, a node where a supply voltage for said semiconductor chip is to appear residing downstream from an output of said rectifier, a diode's cathode coupled to said node, said diode's anode coupled to wiring that provides said semiconductor chip's supply voltage while said semiconductor chip is being tested on wafer.

14. The apparatus of claim 13 wherein said semiconductor chip further comprises a second signal path flowing into said receive signal path from a die edge of said semiconductor chip, said second signal path to transport an electrical test signal that emulates said receive signal while said semiconductor chip is being tested on wafer.

15. The apparatus of claim 14 wherein said receive signal path flows through both a first input of a multiplexer and said multiplexer's output, said multiplexer having a second input coupled to said second signal path.

16. The apparatus of claim 15 wherein said multiplexer's channel select input is coupled to any of:
a passive pull-up resistor;
a passive pull-down resistor;
an active pull-up device;
a passive pull-down device
to cause said channel select input to have a first state while said semiconductor chip is being tested on wafer and a second state while said semiconductor chip is receiving said signal from said antenna.

17. The apparatus of claim 16 wherein said test signal path is said second signal path.

18. The apparatus of claim 13 wherein said semiconductor chip further comprises a multiplexer to multiplex between test signals generated while said semiconductor chip is being tested on wafer, said multiplexer having its power supply node coupled to said wiring.

19. The apparatus of claim 13 wherein said receive signal path flows to a controller.

20. The apparatus of claim 19 wherein said controller is coupled to a non-volatile memory.

21. An apparatus, comprising:
a semiconductor chip for an RFID tag comprising a receive signal path from one or more primary inputs to a controller, said receive signal path to process an electrical receive signal originating from said inputs as a consequence of said inputs having received a signal from an antenna, said semiconductor chip also comprising a response signal path that flows from said controller through an impedance controller to said inputs, said response signal path to communicate to a system that sends a wireless signal to said antenna, a third signal path flowing from said response signal path to a die edge of said semiconductor chip, said third signal path to transport a response signal while said semiconductor chip is being tested on wafer.

22. The apparatus of claim 21 wherein said third signal path flows to an open circuit residing within the semiconductor substrate of said semiconductor chip, said open circuit caused by the scribing of said wafer.

23. The apparatus of claim 21 wherein said semiconductor chip further comprises a fourth signal path flowing into said receive signal path from a die edge of said semiconductor chip, said fourth signal path to transport an electrical test signal that emulates said receive signal while said semiconductor chip is being tested on wafer.

24. The apparatus of claim 23 wherein said receive signal path flows through both a first input of a multiplexer and said multiplexer's output, said multiplexer having a second input coupled to said fourth signal path.

25. The apparatus of claim 24 wherein said fourth signal path traces back to an open circuit, said open circuit caused by the scribing of said wafer.

26. The apparatus of claim 25 wherein, at the region of said open circuit, said signal path flows through said semiconductor chip's semiconductor substrate.

27. The apparatus of claim 24 wherein said multiplexer's channel select input is coupled to any of:
a passive pull-up resistor;
a passive pull-down resistor;
an active pull-up device;
an active pull-down device;
to cause said channel select input to have a first state while said semiconductor chip is being tested on wafer and a second state while said semiconductor chip is receiving said signal from said antenna.

28. The apparatus of claim 27 wherein said semiconductor chip further comprises a rectifier coupled to at least one of said inputs, a node where a supply voltage for said semiconductor chip is to appear residing downstream from an output of said rectifier, a diode's cathode coupled to said node, said diode's anode coupled to wiring that provides said semiconductor chip's supply voltage while said semiconductor chip is being tested on wafer.

29. The apparatus of claim 22 wherein said semiconductor chip further comprises a rectifier coupled to at least one of said inputs, a node where a supply voltage for said semiconductor chip is to appear residing downstream from an output of said rectifier, a diode's cathode coupled to said node, said diode's anode coupled to wiring that provides said semiconductor chip's supply voltage while said semiconductor chip is being tested on wafer.

30. A method, comprising:
applying a supply voltage to a semiconductor chip for an RFID tag that has not yet been diced from its wafer, said supply voltage applied to said semiconductor chip at a die edge of said semiconductor chip, a channel of a multiplexer of said semiconductor chip being enabled as a consequence of said applying; and,
propagating a test signal through said multiplexer channel as part of testing said semiconductor chip on wafer.

31. The method of claim 30 further comprising ceasing said application of said supply voltage to said semiconductor chip after said on wafer testing of said semiconductor chip is complete.

32. The method of claim 31 further comprising dicing said semiconductor chip from said wafer.

33. The method of claim 32 further comprising receiving a wireless signal at an antenna coupled to, said semiconductor chip generating a second supply voltage in response, another channel of said multiplexer being enabled as a consequence of said generating.

34. The method of claim 33 wherein:
data carried by said wireless signal flows through said another channel; and,
said test signal includes test data intended to emulate wirelessly received data.

35. The method of claim 34 wherein, prior to said propagating said test signal through said multiplexer, said test signal was propagated through a scribe region of said wafer.

36. The method of claim 30 wherein said test signal includes test data intended to emulate wirelessly received data.

37. The method of claim 36 wherein said semiconductor chip comprises a controller coupled to non-volatile memory, said test data being write data to be written into said non-volatile memory by said controller.

38. The method of claim 37 wherein said test signal includes a command for said controller that causes said controller to write said test data into said non-volatile memory.

39. The method of claim 38 further comprising sending a second command to said controller through said multiplexer channel as part of testing said semiconductor chip on wafer, said second command to cause said controller to read data from said non-volatile memory.

40. The method of claim 39 further comprising sending said data read from said non-volatile memory off said semiconductor chip to a wafer test probe.

41. The method of claim 30 further comprising after said applying and prior to said propagating: specifically addressing said semiconductor chip from a wafer test probe, said test signal received by said semiconductor chip as well as other semiconductor chips on said wafer, said addressing to ensure that said test signal is applied at said semiconductor chip and not at said other semiconductor chips.

42. The method of claim 41 wherein said wafer test probe also sends said test signal.

43. The method of claim 41 wherein said addressing further comprises sending an identifier to said semiconductor chip as well as said other semiconductor chips, said identifier matching said semiconductor chip's identifier and not any of said other semiconductor chips' identifiers, each identifier being uniquely coded into its respective semiconductor chip.

44. The method of claim 30 wherein said semiconductor chip comprises a controller coupled to non-volatile memory, said method comprising sending write data to said semiconductor chip as part of testing said semiconductor chip on wafer, said write data to be written into said non-volatile memory by said controller, said write data containing information that emulates said semiconductor chip's identification.

45. The method of claim 30 wherein a multiplexer designed into said semiconductor chip is powered from said applying but not from said semiconductor chip's generation of its supply voltage from its reception of a signal received from an antenna.

* * * * *

UNITED STATES PATENT AND TRADEMARK OFFICE
CERTIFICATE OF CORRECTION

PATENT NO. : 7,307,528 B2 Page 1 of 1
APPLICATION NO. : 11/014075
DATED : December 11, 2007
INVENTOR(S) : Glidden et al.

It is certified that error appears in the above-identified patent and that said Letters Patent is hereby corrected as shown below:

In column 1, line 13, delete "titled." and insert -- titled, --, therefor.

In column 4, line 59, delete "210;," and insert -- 210, --, therefor.

In column 7, line 25, delete "and," and insert -- and --, therefor.

In column 7, line 67, delete "p+contact" and insert -- p+ contact --, therefor.

In column 10, line 11, delete "the." and insert -- the --, therefor.

In column 10, line 45, delete "seervice" and insert -- service --, therefor.

In column 14, line 45, delete "psuedo" and insert -- pseudo --, therefor.

In column 15, line 7, delete "psuedo" and insert -- pseudo --, therefor.

Signed and Sealed this

Twenty-ninth Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 7,307,528 B2
APPLICATION NO. : 11/014075
DATED : December 11, 2007
INVENTOR(S) : Glidden et al.

It is certified that error appears in the above-identified patent and that said Letters Patent is hereby corrected as shown below:

In column 1, line 13, delete "titled." and insert -- titled, --, therefor.

In column 4, line 59, delete "210;," and insert -- 210, --, therefor.

In column 7, line 25, delete "and," and insert -- and --, therefor.

In column 7, line 67, delete "p+contact" and insert -- p+ contact --, therefor.

In column 10, line 11, delete "the." and insert -- the --, therefor.

In column 10, line 45, delete "seervice" and insert -- service --, therefor.

In column 14, line 45, delete "psuedo" and insert -- pseudo --, therefor.

In column 15, line 7, delete "psuedo" and insert -- pseudo --, therefor.

Signed and Sealed this

Tenth Day of June, 2008

JON W. DUDAS
*Director of the United States Patent and Trademark Office*